(12) United States Patent
Saito et al.

(10) Patent No.: US 6,781,872 B2
(45) Date of Patent: Aug. 24, 2004

(54) MAGNETIC MEMORY

(75) Inventors: Yoshiaki Saito, Kanagawa-ken (JP); Hiroaki Yoda, Kanagawa-ken (JP); Yoshiaki Asao, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/330,115

(22) Filed: Dec. 30, 2002

(65) Prior Publication Data

US 2003/0147289 A1 Aug. 7, 2003

(30) Foreign Application Priority Data

Dec. 28, 2001 (JP) .......................................... 2001-401342
Sep. 30, 2002 (JP) .......................................... 2002-286653

(51) Int. Cl.[7] ................................................ G11C 11/00
(52) U.S. Cl. ........................ 365/158; 365/171; 365/173
(58) Field of Search ................................. 365/158, 171, 365/173

(56) References Cited

U.S. PATENT DOCUMENTS

| | | | | |
|---|---|---|---|---|
| 5,640,343 A | * | 6/1997 | Gallagher et al. | 365/171 |
| 5,734,605 A | * | 3/1998 | Zhu et al. | 365/173 |
| 6,532,163 B2 | * | 3/2003 | Okazawa | 365/97 |
| 2002/0154538 A1 | * | 10/2002 | Inui | 365/158 |

FOREIGN PATENT DOCUMENTS

| | | |
|---|---|---|
| DE | 197 44 095 | 4/1999 |
| WO | WO 99/14760 | 3/1999 |

OTHER PUBLICATIONS

Jagadeesh S. Moodera, et al., Ferromagnetic–Insulator–Ferromagnetic Tunneling: Spin–Dependent Tunneling and Large Magnetoresistance in Trilayer Junctions (Invited), Symposium on Spin Tunneling and Injection Phenomena, J. Appl. Phys. 79 (8), Apr. 15, 1996, pp. 4724–4729.

L.F. Schelp. et al., "Spin–Dependent Tunneling with Coulomb Blockade", Physical Review B, Vol. 56, No. 10, Rapid Communications, Sep. 1, 1997, pp. R5747–R5750.

F. Montaigne, et al., "Enhanced Tunnel Magnetoresistance at High Bias Voltage in Double–Barrier Planar Junctions", Applied Physics Letters, vol. 73, No. 19, Nov. 9, 1998, pp. 2829–2831.

Yoshiaki Saito, et al., Correlation Between Barrier Width, Barrier Height, and DC Bias Voltage, Dependences on the Magnetoresistance Ratio in Ir–Mn Exchange Biased Single and Double Tunnel Junctions, Japan J. Appl. Phys. vol. 39, Oct. 15, 2000, pp. L1035–1038.

* cited by examiner

*Primary Examiner*—Richard Elms
*Assistant Examiner*—Nam Nguyen
(74) *Attorney, Agent, or Firm*—Oblon, Spivak, McClelland, Maier & Neustadt, P.C.

(57) ABSTRACT

A magnetic memory includes first and second magnetoresistance effect elements (C1, C2) stacked on and under a first wiring (BL); and second and third wirings (DL1, DL2) extending perpendicularly to the first wiring (BL), such that one of two values of two-valued information is recorded by supplying a current to the first wiring while supplying a current to the second and third wirings respectively, and thereby simultaneously reverting magnetization in recording layers of the first and second magnetoresistance effect elements to predetermined directions respectively; and a difference between output signals obtained from the first and second magnetoresistance effect elements by supplying a sense current thereto via the first wiring is detected and read out as one of two values of the two-valued information.

21 Claims, 34 Drawing Sheets

Case1 (C1"0", C2"0")

Tr1 "ON"

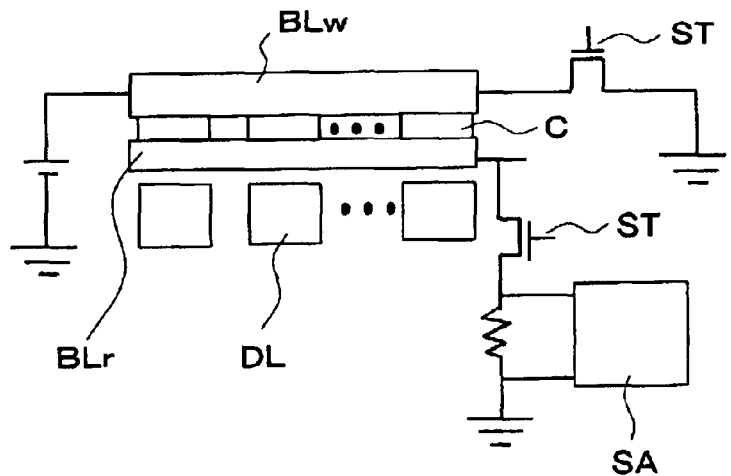
FIG.22
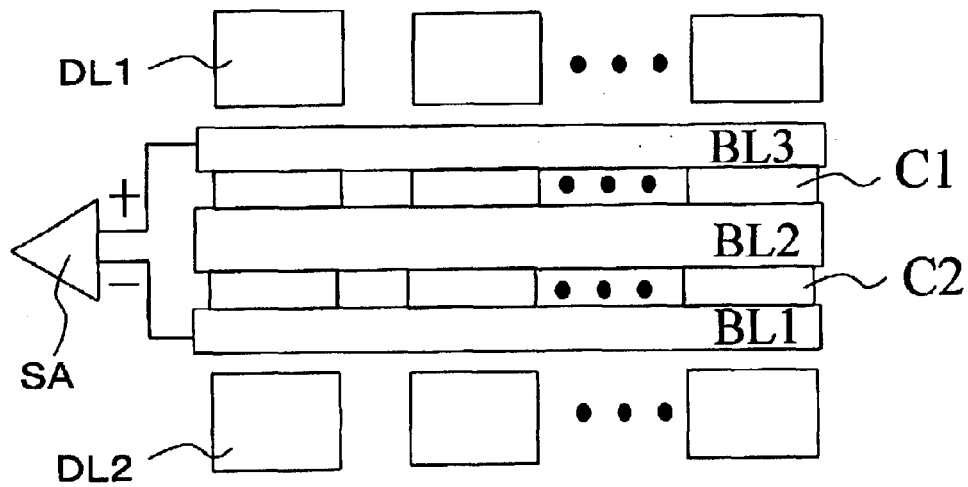
FIG.23A
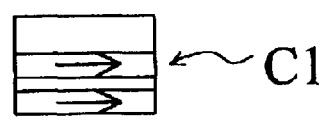
FIG.23B

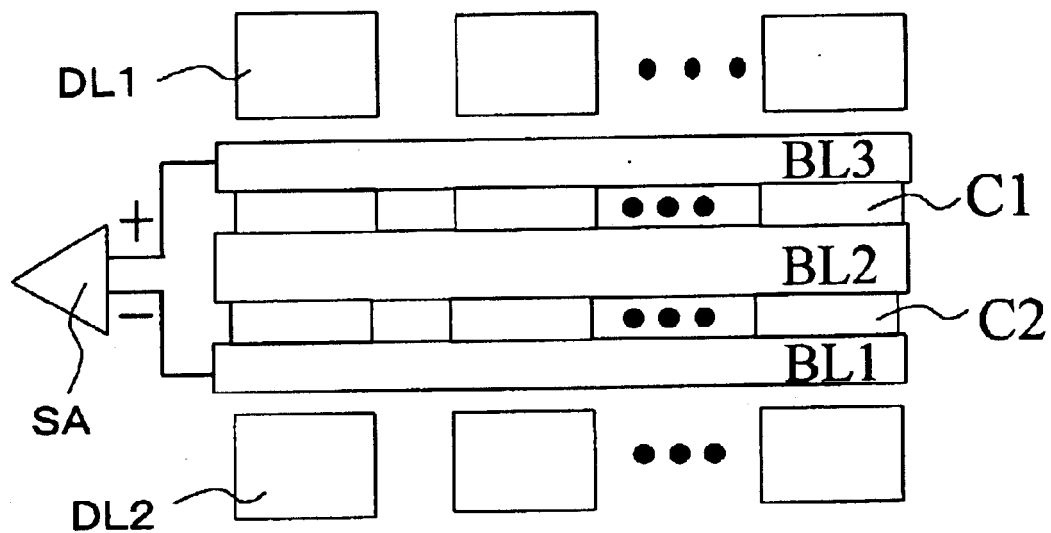
FIG.24A
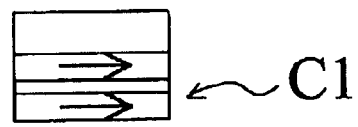
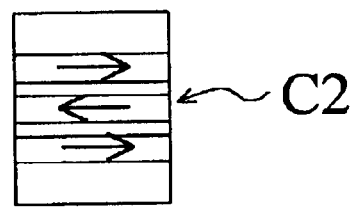
FIG.24B
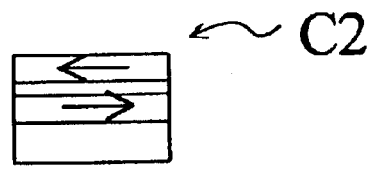
FIG.24C

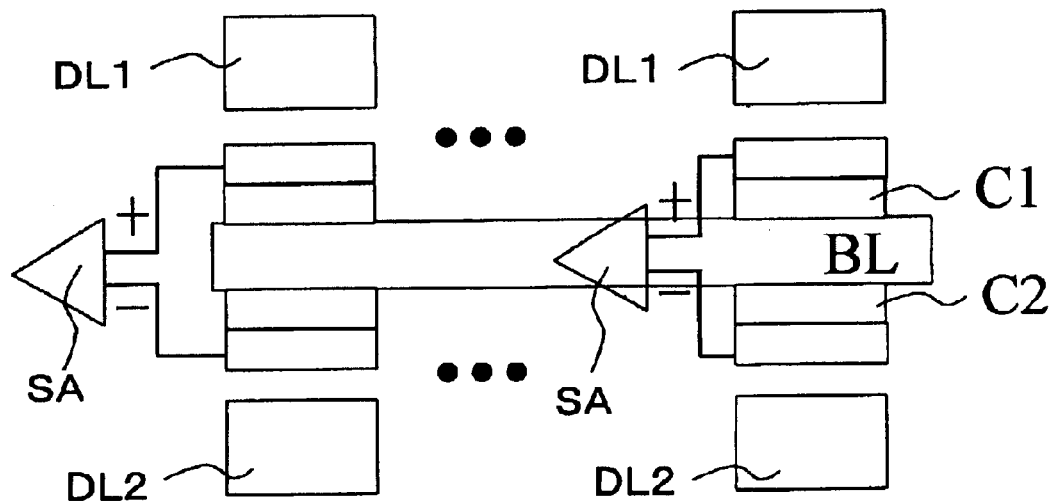
FIG.27A
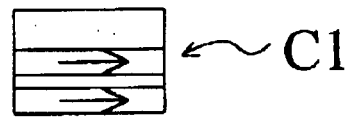
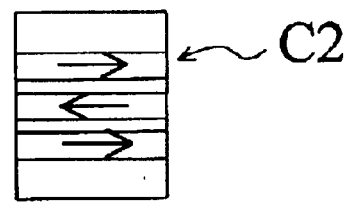
FIG.27B
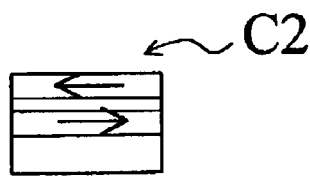
FIG.27C

| | $V_{AP}$ | $V_P$ |
|---|---|---|
| TMR2 OUTPUT (mV) | Va=395 | Vb=225 |
| TMR1 OUTPUT (mV) | Vc=315 | Vd=235 |

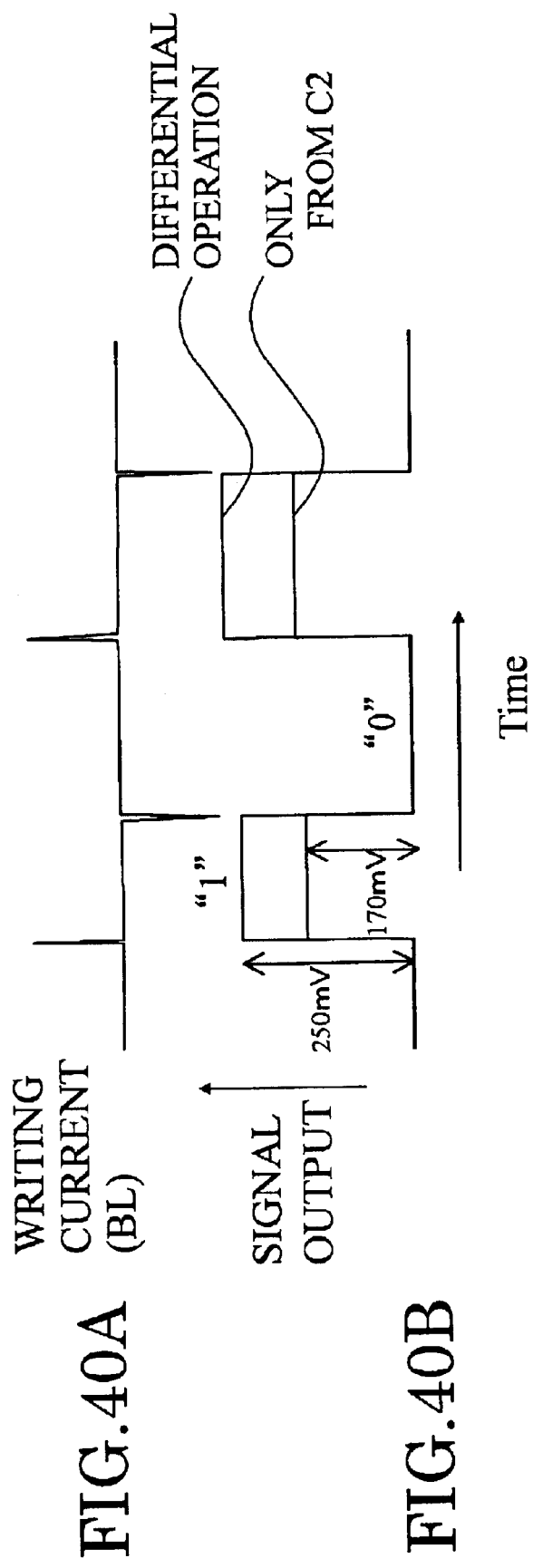

|  | $V_{AP}$ | $V_P$ |
|---|---|---|
| TMR2 OUTPUT(mV) | Va=497.5 | Vb=312.5 |
| TMR1 OUTPUT (mV) | Vc=405 | Vd=310 |

FIG.42

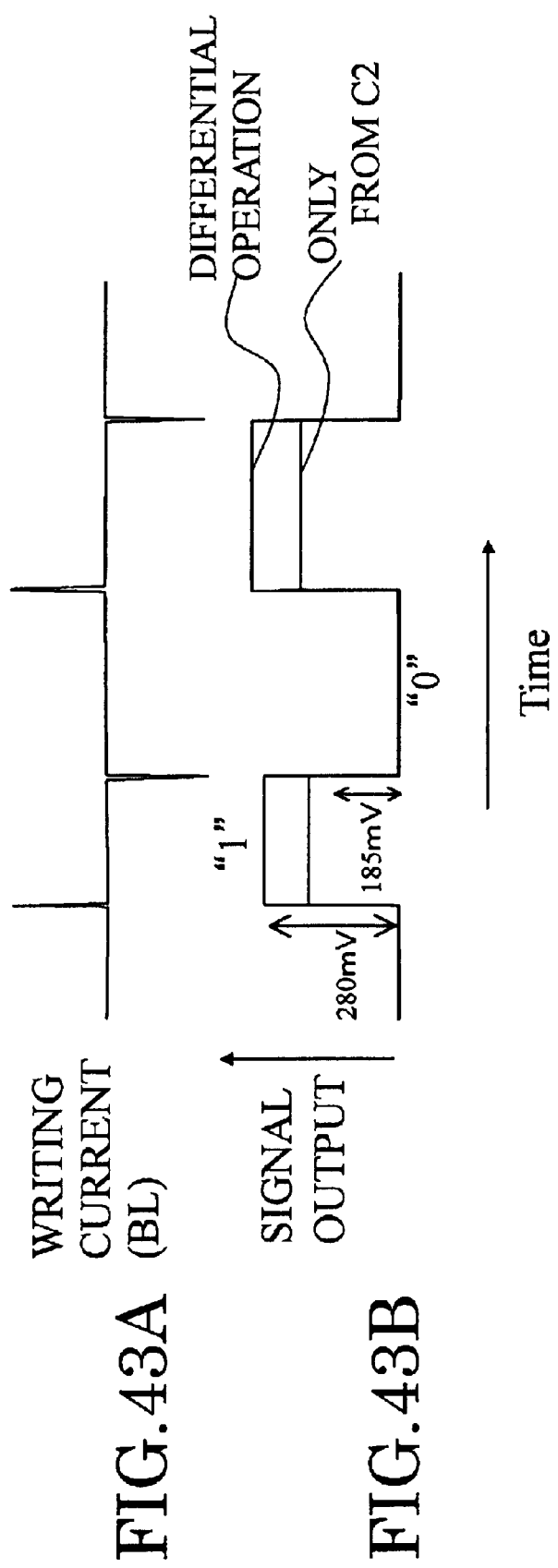

MAGNETIC MEMORY

CROSS-REFERENCE TO RELATED APPLICATIONS

This application is based upon and claims the benefit of priority from the prior Japanese Patent Application No. 2001-401342, filed on Dec. 28, 2001, and the prior Japanese Patent Application No. 2002-286653, filed on Sep. 30, 2002; the entire contents of which are incorporated herein by reference.

BACKGROUND OF THE INVENTION

This invention relates to a magnetic memory, and more particularly, to a large-capacity high-speed magnetic memory having a structure stacking memory arrays including magnetoresistance effect elements of a ferromagnetic tunneling type, for example, and reduced in influences from fluctuations of properties such as junction resistance and MR ratio.

Magnetoresistance effect elements using magnetic films are currently used in magnetic heads, magnetic sensors, etc., and there is a proposal to use magnetoresistance effect elements in a solid-state magnetic memory (magnetoresistance memory or MRAM (magnetic random access memory)).

Recently, a so-called "tunneling magnetoresistance effect element (TMR element) has been proposed as a magnetoresistance effect element configured to flow a current perpendicularly to the film plane in a sandwich-structured film interposing a single dielectric layer between two magnetic metal layers and to use the tunneling current. Since tunneling magnetoresistance effect elements have been improved to ensure 20% or higher ratio of change in magnetoresistance (J. Appl. Phys. 79, 4724 (1996)), the possibility of civilian applications of MRAM is increasing.

A tunneling magnetoresistance effect element can be obtained by first forming a thin Al (aluminum) layer, 0.6 nm through 2.0 nm thick, on a ferromagnetic electrode, and thereafter exposing its surface to a glow discharge of oxygen or oxygen gas to form a tunnel barrier layer of $Al_2O_3$.

There is also proposed a ferromagnetic single tunneling junction structure in which an anti-ferromagnetic layer is provided in one of the ferromagnetic layers on one side of the single ferromagnetic tunneling junction and the other ferromagnetic layer is used as a magnetically pinned layer (Japanese Patent Laid-Open Publication No. H10-4227).

Other type ferromagnetic tunneling junction structures, namely, one having a ferromagnetic tunneling junction via magnetic particles distributed in a dielectric material and one having double ferromagnetic tunneling junctions (continuous film) have been proposed as well (Phys. Rev. B56(10), R5747 (1997), J. The Magnetics Society of Japan 23, 4–2, (1999), Appl. Phys. Lett. 73(19), 2829 (1998), Jpn. J. Appl. Phys. 39, L1035(2001)).

Also these ferromagnetic tunneling junctions have been improved to ensure a ratio of magnetoresistive change from 20 to 50% and to prevent a decrease of the ratio of magnetoresistive change even upon an increase of the voltage value applied to tunneling magnetoresistance effect elements to obtain a desired output voltage, and there is the possibility of their applications to MRAM.

Magnetic recording elements using such a single ferromagnetic tunneling junction or double ferromagnetic tunneling junctions are nonvolatile and have high potentials such as high write and read speed not slower than 10 nanoseconds and programmable frequency not less than $10^{15}$ times. Especially, ferromagnetic double-tunneling structures ensure large output voltages and exhibit favorable properties as magnetic recording elements because the ratio of magnetoresistive change does not decrease even upon an increase of the voltage value applied to tunneling magnetoresistance effect elements to obtain a desired output voltage value as mentioned above.

With regard to the memory cell size, however, those existing techniques involve the problem that the size cannot be decreased below semiconductor DRAM (dynamic random access memory) when a 1 Tr (transistor)-1 TMR architecture (disclosed, for example, in U.S. Pat. No. 5,734,605) is employed.

For overcoming the problem, there are proposals such as a diode-type architecture in which TMR cells and diodes are serially connected between bit lines and word lines (U.S. Pat. No. 5,640,343), and a simple-matrix architecture in which TMR cells are placed between bit lines and word lines (DE 19744095, WO 9914760).

However, if the bit size is decreased to increase the memory capacity, then the output from the magnetoresistance effect element also decreases, and S/N upon recording and reproduction decreases.

In case two magnetoresistance effect elements are combined to perform so-called "differential operation" by recording data in these elements in a complementary manner and detecting a difference between their outputs, it is possible to double the output signal and obtain higher S/N. However, in order to perform such differential operation, recording and reading with the pair of combined magnetoresistance effect elements must be conducted under the same condition. If the recording or reading condition of one of the magnetoresistance effect elements varies, the output signal also varies, and a recording/reproducing error occurs.

Therefore, an architecture less affected by such fluctuations is indispensable to realize a giant capacity magnetic memory.

SUMMARY OF THE INVENTION

According to an embodiment of the invention, there is provided a magnetic memory comprising:

a first wiring extending in a first direction;

a first magnetoresistance effect element formed on the first wiring and having a magnetic recording layer;

a second magnetoresistance effect element formed under the first wiring and having a magnetic recording layer;

a second wiring extending in a direction across the first direction above the first wiring;

a third wiring extending in a direction across the first direction below the first wiring;

a recording circuit which supplies a current to the first wiring while supplying a current to the second and third wirings respectively, and thereby exerting a current magnetic field to the magnetic recording layers in order to record one of two values of two-valued information; and a reading circuit which detects a difference between output signals obtained from the magnetoresistance effect elements by supplying a sense current to the first and second magnetoresistance effect elements via the first wiring in order to read out the recorded data as one of two values of the two-valued information, directions of magnetization in the recording layers of the first and second magnetoresistance effect elements being oriented in opposite directions from each other by supplying the current to the first wiring upon recording of one of two values of the two-valued information.

According to another embodiment of the invention, there is provided a magnetic memory comprising:

a first wiring extending in a first direction;

a first magnetoresistance effect element formed on the first wiring and having a magnetic recording layer;

a second magnetoresistance effect element formed under the first wiring and having a magnetic recording layer;

a second wiring extending in a direction across the first direction above the first wiring;

a third wiring extending in a direction across the first direction below the first wiring;

one end of the second wiring and one end of the third wiring being connected together to form a single current path;

a recording circuit which supplies a current to the first wiring while supplying a current to the single current path, and thereby exerting a current magnetic field to the magnetic recording layers in order to record one of two values of two-valued information; and a reading circuit which detects a difference between output signals obtained from the magnetoresistance effect elements by supplying a sense current to the first and second magnetoresistance effect elements via the first wiring in order to read out the recorded data as one of two values of the two-valued information, directions of magnetization in the recording layers of the first and second magnetoresistance effect elements being oriented in opposite directions from each other by supplying the current to the first wiring upon recording of one of two values of the two-valued information.

According to yet another embodiment of the invention, there is provided a magnetic memory comprising:

a first wiring extending in a first direction;

a first magnetoresistance effect element formed on the first wiring and having a magnetic recording layer;

a second magnetoresistance effect element formed under the first wiring and having a magnetic recording layer;

a second wiring extending in a direction across the first direction above the first wiring;

a third wiring extending in a direction across the first direction below the first wiring;

a recording circuit which supplies a current to the first wiring while supplying a current to at least one of the second and third wirings, and thereby exerting a current magnetic field to at least one of the magnetic recording layers in order to record one of multiple values of multi-valued information; and a reading circuit which detects a difference between output signals obtained from the magnetoresistance effect elements by supplying a sense current to the first and second magnetoresistance effect elements via the first wiring in order to read out the recorded data as one of multiple values of the multi-valued information According to yet another embodiment of the invention, there is provided a magnetic memory comprising:

a first wiring extending in a first direction;

a first magnetoresistance effect element formed on the first wiring and having a magnetic recording layer;

a second magnetoresistance effect element formed under the first wiring and having a magnetic recording layer;

a second wiring extending in a direction across the first direction above the first wiring;

a third wiring extending in a direction across the first direction below the first wiring;

a switching element connected between one end of the second wiring and one end of the third wiring;

a recording circuit which controls the switching element to hold the one end of the second wiring and the one end of the third wiring in connection to form a single current path and supplies a current to the first wiring while supplying a current to the single current path, and thereby exerting a current magnetic field to the magnetic recording layers in order to record one of multiple values of multi-valued information, the recording circuit controlling the switching element to hold the one end of the second wiring and the one end of the third wiring in disconnection and supplying a current to the first wiring while supplying a current to at least one of the second and third wirings, and thereby exerting a current magnetic field to at least one of the magnetic recording layers in order to record another of multiple values of the multi-valued information; and a reading circuit which detects a difference between output signals obtained from the magnetoresistance effect elements by supplying a sense current to the first and second magnetoresistance effect elements via the first wiring in order to read out the recorded data as one of the multiple values of the multi-valued information.

Because the above-summarized structure uses the pair of magnetoresistance effect elements stacked on and under the first wiring and makes use of their differential operation, it contributes to preventing fluctuations of the wiring environment, stabilizing the differential operation, simplifying the memory cell structure and thereby realizing a large-capacity high-integrated memory.

In the specification, the term "multi-valued information" means information of three or more values, such as information of four values including the "0" level, "1" level, "2" level and "3" level.

According to this and other embodiments of the invention, wiring environments of the pair of magnetoresistance effect elements can be uniformed by locating these magnetoresistance effect elements closely on and under the bit line.

As a result, even upon differential operation or multi-valued recording, reading or writing errors caused by fluctuations of signals can be removed.

Additionally, since the degree of integration of memory cells can be increased and their structure can be simplified, a giant-capacity, high-speed magnetic memory can be realized easily.

BRIEF DESCRIPTION OF THE DRAWINGS

The present invention will be understood more fully from the detailed description given herebelow and from the accompanying drawings of the embodiments of the invention. However, the drawings are not intended to imply limitation of the invention to a specific embodiment, but are for explanation and understanding only.

In the drawings:

FIG. 22 is a schematic diagram showing the third specific example of the architecture available for stacking memory arrays;

FIGS. 23A and 23B are cross-sectional schematic diagrams showing a memory cell of a differential operation type made by using the architecture of FIG. 22;

FIGS. 24A through 24C are cross-sectional schematic diagrams showing a memory cell of a multi-valued recording type made by using the architecture of FIG. 22;

FIGS. 27A through 27C are cross-sectional schematic diagrams showing a memory cell of a multi-valued recording type made by using the architecture of FIG. 25;

FIGS. 40A and 40B are graph diagrams showing a result of differential operation;

FIG. 42 is a table showing measured values of output voltages of magnetoresistance effect elements C1, C2 obtained in the second Example of the invention;

FIGS. 43A and 43B are graph diagrams showing a result of differential operation;

DETAILED DESCRIPTION OF THE INVENTION

Some embodiments of the invention will now be explained below with reference to the drawings.

Figure 1:
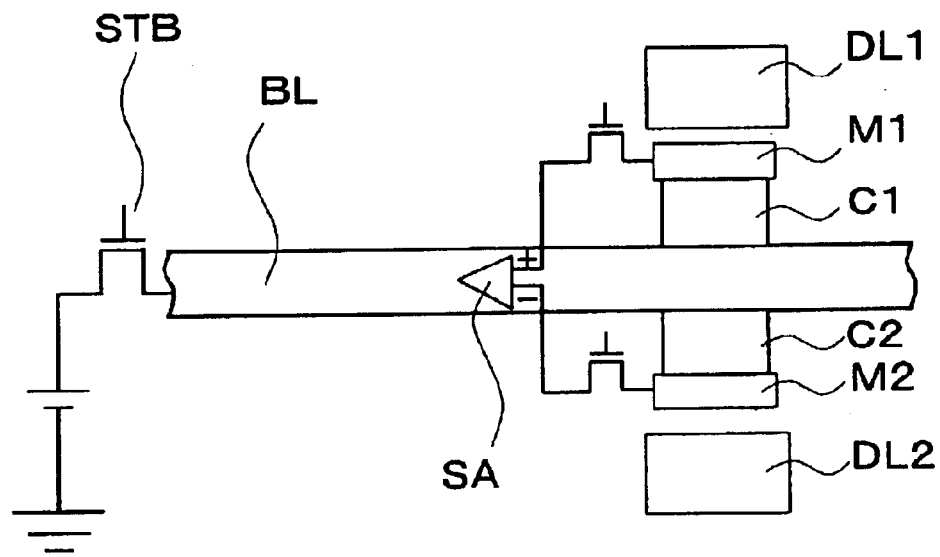
FIG. 1 is a schematic cross-sectional view illustrating a multi-layered structure of a unit cell in a magnetic memory according to an embodiment of the invention in a simplified form.

FIG. 1 is a schematic cross-sectional view illustrating a multi-layered structure of a unit cell in a magnetic memory according to an embodiment of the invention in a simplified form. In this embodiment, a pair of magnetoresistance effect elements C1, C2 are disposed on and under a bit line BL as shown in FIG. 1.

In the specific example shown here, digit lines DL1, DL2, read wirings M1, M2 are formed to extend across a bit line BL, and a pair of magnetoresistance effect elements C1, C2 are formed at the crossing area between the bit line BL and the digit lines DL1, DL2.

These magnetoresistance effect elements C1, C2, which will be explained later in greater detail, each have a recording layer made of a ferromagnetic layer, and magnetization of opposite directions is recorded in these recording layers. That is, the pair of magnetoresistance effect elements C1, C2 operate in a complementary manner. Reproduced signals from the magnetoresistance effect elements C1, C2 are differentially operated by an amplifier SA through read wirings M1, M2. In this manner, reproduced signals from the magnetoresistance effect elements can be doubled, and recording and reproduction with high S/N (signal to noise) can be carried out.

As explained later in greater detail, this architecture enables multi-valued recording when the upper and lower magnetoresistance effect elements C1, C2 are changed in signal output.

The embodiment of the invention makes it possible to prevent influences of a difference of the wiring environments, simultaneously reduce the cell area and therefore realize a high degree of integration by stacking the magnetoresistance effect elements for differential operation closely on and under the bit line BL.

That is, by close positioning of the pair of magnetoresistance effect elements C1, C2 on and under the bit line BL, information can be read out (or written) with the upper and lower magnetoresistance effect elements C1, C2 via the same bit line BL, and "deviation" caused by a difference of the wiring path environments can be prevented. This result is remarkable especially when differential operation or multi-valued recording is carried out by using the pair of magnetoresistance effect elements, and read (or write) errors caused by a difference of the wiring environment between the upper and lower magnetoresistance effect elements can be prevented reliably and easily.

Additionally, according to the embodiment of the invention, since the pair of magnetoresistance effect elements C1, C2 are closely located on and under the bit line BL, the element structure can be simplified and compacted. Therefore, the embodiment is advantageous also for realization of a high degree of integration and easier fabrication.

As explained later in greater detail, various specific examples can be employed for connection of the bit line BL and digit lines DL (DL1, DL2) with the magnetoresistance effect elements C (C1, C2). For example, two bit lines may be provided for the writing use and the reading use, respectively, and may be connected to the magnetoresistance effect elements. The digit lines may be connected to the magnetoresistance effect elements in a specific example, or need not be connected in another specific example.

Although FIG. 1 shows the pair of magnetoresistance effect elements C1, C2 as lying in approximately symmetric positions on and under the bit line BL, the invention is not limited to such configurations. In embodiments of the invention, it is sufficient that the wiring environments are substantially equal between the upper and lower magnetoresistance effect elements.

Figure 2:
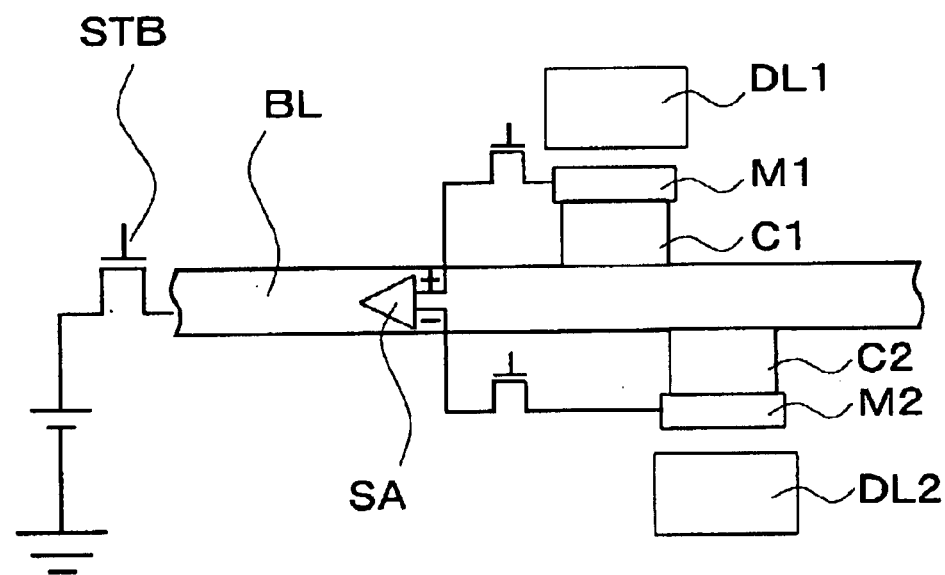
FIG. 2 is a schematic diagram showing a specific example in which a pair of magnetoresistance effect elements C1, C2 are offset in the lengthwise direction of a bit line BL.

Therefore, as shown in FIG. 2, for example, the pair of magnetoresistance effect elements C1, C2 may be "offset" to a certain extent along the lengthwise direction of the bit line BL. Alternatively, the magnetoresistance effect elements C1, C2 may be offset along the width direction of the bit line BL.

Each magnetoresistance effect element C (C1, C2) has a "TMR (tunneling magnetoresistance effect)" structure, "spin valve" structure, or other like structure. In any of these cases, the magnetoresistance effect element includes a magnetic recording layer made of a ferromagnetic material. Information can be recorded in this recording layer by applying magnetization of a predetermined orientation.

Separately from the magnetic recording layer, each magnetoresistance effect element C includes a magnetically pinned layer in which direction of magnetization is fixed in a predetermined direction. Accordingly, in each magnetoresistance effect element C, its output signal changes in accordance with the relation of magnetization between the pinned layer and the magnetic recording layer. Therefore, if the directions of magnetization of the magnetic recording layers or the magnetically pinned layers are determined to double the outputs of the upper and lower magnetoresistance effect elements C1, C2, the two-valued information of "1" and "0" can be recorded or reproduced with a high S/N ratio by their differential operation.

If the magnetoresistance effect elements C1, C2 are configured to be different in output current level, multi-valued recording is possible. For example, as explained later in greater detail, when the output levels of the upper and lower magnetoresistance effect elements C1, C2 are changed by changing their structures, another output level other than two kinds of output levels, namely the doubled or canceling-out, when they elements are operated in a differential mode.

Writing of information in the magnetoresistance effect elements C (C1, C2) can be carried out with magnetic fields generated by, for example, flowing a current pulse to the digit lines DL (DL1, DL2) and the bit line BL on and under the elements C. More specifically, when an electric current is supplied to the bit line BL and the digit lines DL1, DL2, current magnetic fields are generated around them. A writing magnetic field composing these current magnetic fields reverts magnetization of the magnetic recording layers of the magnetoresistance effect elements C1, C2. Upon such writing, a current pulse in the optimum direction to generate a composite magnetic field in a predetermined direction may be appropriately flown to the bit line BL and the digit lines DL1, DL2.

In this manner, it is possible to reduce the quantity of current per each wiring and facilitate selection of a cell for writing as compared with the technique relying on generating magnetic reversal by flowing a current solely to the bit line or the digit lines. This contributes to realizing a reliable magnetic memory reduced in wiring fatigue.

Figures 3A, 3B:
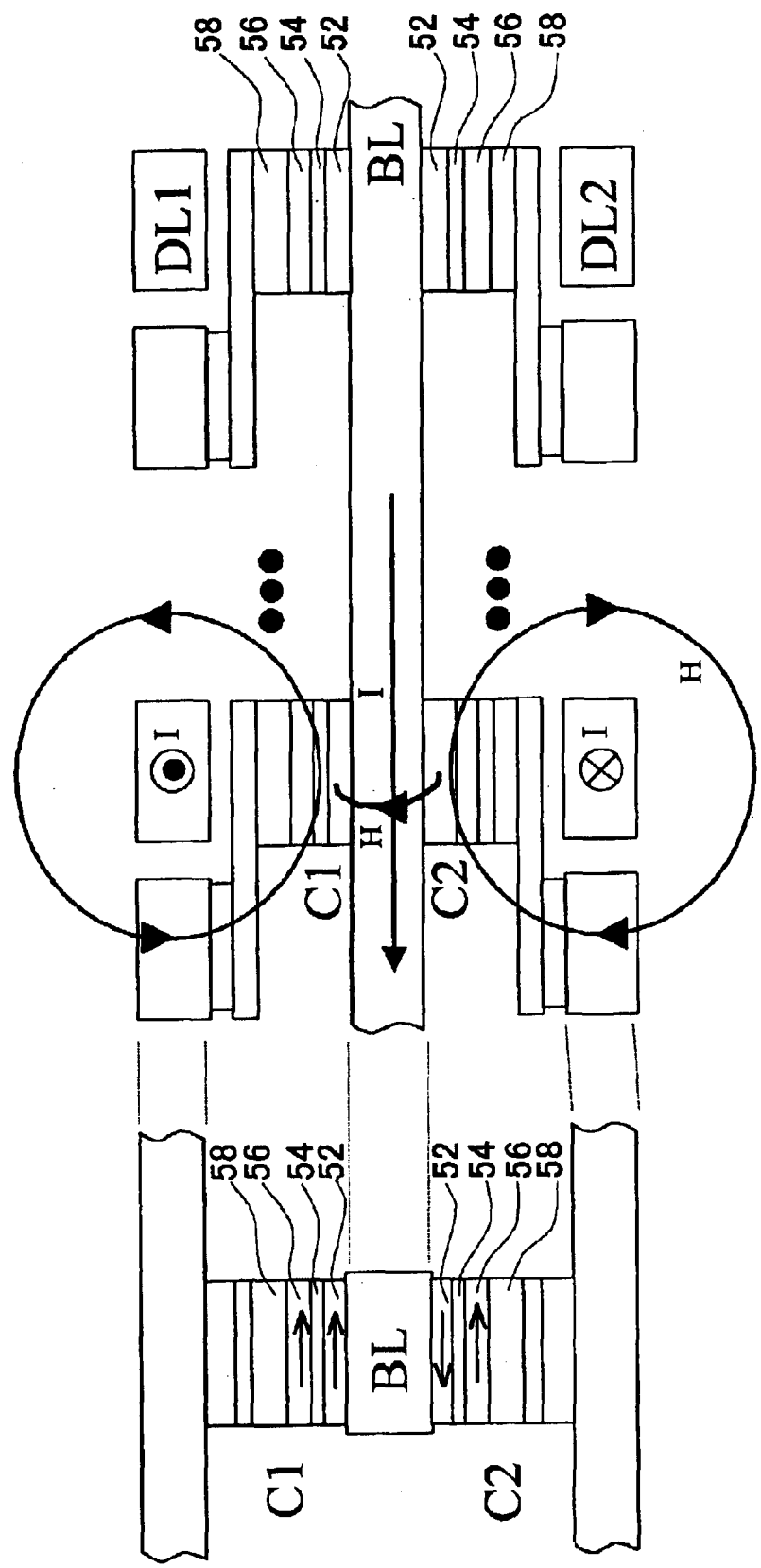
FIGS. 3A and 3B are schematic diagrams for explaining data writing in case a differential operation architecture is employed.
Figures 4A, 4B:
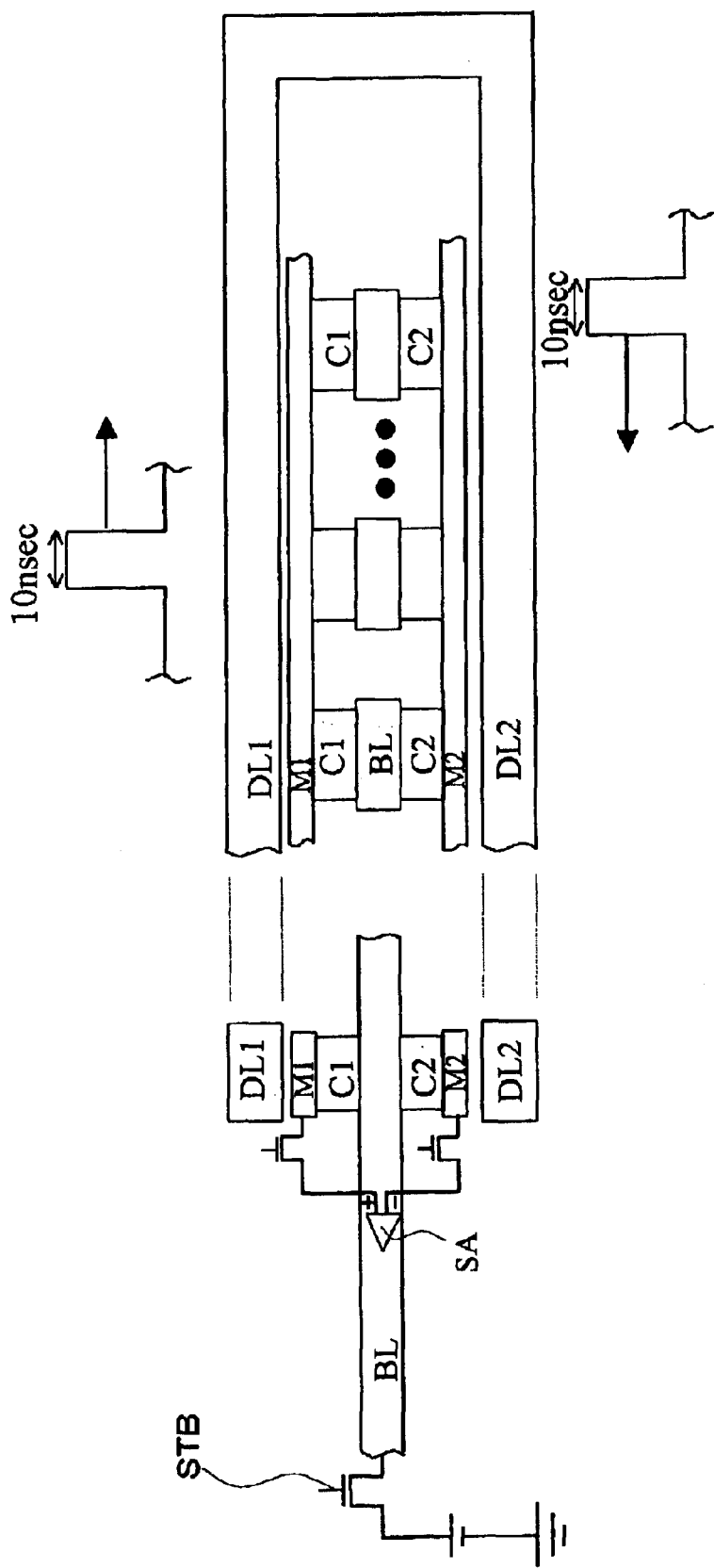
FIGS. 4A and 4B are schematic diagrams showing a wiring structure in which end portions of digit lines DL1, DL2 connected respectively on and under the magnetoresistance effect elements C1, C2 are connected together.

FIGS. 3A and 3B are schematic diagrams for explaining data writing in case a differential operation architecture is employed. FIG. 3A is a cross-sectional view taken along a plane perpendicular to the lengthwise direction of the bit line BL. FIG. 3B is a cross-sectional view taken along a plane parallel to the lengthwise direction of the bit line BL.

The magnetoresistance effect elements C1, C2 shown here are tunneling magneto-resistance effect (TMR) elements in which a ferromagnetic layer 52, tunnel barrier layer 54, ferromagnetic layer magnetically pinned in a predetermined direction (also called "pinned layer" or "magnetically pinned layer") 56, and anti-ferromagnetic layer 58 are stacked in the written order. The anti-ferromagnetic layer 58 functions to pin the magnetization of the ferromagnetic layer 56 as the pinned layer.

The magnetoresistance effect elements C1, C2 used in the embodiment of the invention are not limited to TMR elements. A "spin valve" structure having a nonmagnetic layer inserted between a pair of ferromagnetic layer, for example, is also usable.

For writing, a predetermined writing current I is flown to the digit lines DL1, DL2 and the bit line BL, respectively, to apply their composite magnetic field to the recording layers 52 of the magnetoresistance effect elements C1, C2 and appropriately revert the magnetization spins.

In case the magnetoresistance effect elements C1, C2 are operated in a differential mode for recording or reading two-valued information, complementary data are written in the upper and lower magnetoresistance effect elements C1, C2, and their combination is read out as one of two-valued information.

FIGS. 3A and 3B illustrate a method of magnetization spins of the magnetoresistance effect elements C1, C2 by arrows. In this specific example, magnetization of the ferromagnetic layers (pinned layers) 56 of the upper and lower magnetoresistance effect elements C1, C2 is pinned in the same direction. Then the writing is carried out to oppositely orient the upper and lower recording layers 52 in magnetization direction.

For example, as shown in FIGS. 3A and 3B, writing is carried out in the magnetoresistance effect element C1 to orient the magnetization of the recording layer 52 in the same direction (called "parallel direction") of magnetization of the pinned layer 56, and in the magnetoresistance effect element C2 to orient the magnetization of the recording layer 52 in the opposite direction (called "anti-parallel direction") from the magnetization of the pinned layer 56. Then a difference between output voltages (or resistance or current values) of the magnetoresistance effect elements C1, C2 is detected. In this manner, the output signal can be doubled by differential operation, and a high S/N ratio is obtained. This mode of operation will be explained later in greater detail in conjunction with Examples.

When the magnetoresistance effect elements C1, C2 are operated in a differential mode, their easy axes magnetization are preferably oriented in parallel, that is, perpendicularly to the bit line BL. As a result, magnetic fields applied to the upper and magnetoresistance effect elements C1, C2 by flowing a current pulse in the bit line BL function in parallel or in anti-parallel to the easy axes of magnetization of the recording layers. Therefore, information can be written simultaneously in the upper and lower magnetoresistance effect elements C1, C2, and high-speed writing is attained.

In the above-explained architecture, since a current is flown to the upper and lower digit lines, the sum of the current flowing in the digit lines is double the ordinary value, and the architecture is disadvantageous from the viewpoint of the power consumption. Additionally, since the double current must be supplied, the area of the driver for supplying the current to the digit lines inevitably increases. This invites the disadvantage that the ratio of the memory area relative to the chip area (array efficiency) decreases.

To overcome these problems, one of opposite ends of the digit line DL1 and an adjacent end of the digital line DL2 on and under the magnetoresistance effect elements C1, C2 may be connected together as shown in FIGS. 4A, 4B, 5A and 5B.

In case of the structure shown in FIGS. 4A, 4B, 5A and 5B, a plurality of magnetoresistance effect elements C1, C2 are symmetrically positioned on and under the bit line BL, and "1" and "0" can be detected by differential amplification of the upper and lower magnetoresistance effect elements C1, C2.

In the vertical differential MRAM of this type, two digit lines (writing word lines) DL1, DL2 formed to extend in a substantially perpendicular direction relative to the bit line BL are connected together at their adjacent ends into a single wiring. In this manner, writing can be carried out by sending a writing pulse to both digit lines DL1, DL2 from a single power source. The writing pulse continuously propagates through the upper and lower digit lines DL1, DL2. For example, the writing pulse is supplied from the power source (not shown) connected to one end of the digit line DL1 to flow in the digit line DL1. The writing pulse first flows in the digit line DL1 and then flows in the digit line L2 connected to the other end of the digit ling DL1. Writing is carried out in the magnetoresistance effect elements C1, C2 substantially at the same time.

This is because the propagation speed of the current (electrons) flowing in the digit lines DL1, DL2 is very fast in the order of $10^8$ cm/second. Let an example be taken, in which a very short writing pulse as short as 10 nanoseconds is applied. Even in this case, taking the propagation speed of the current into consideration, the spatial size L to which a uniform current magnetic field is applied by means of the writing pulse is L=10 cm/second×10 nanoseconds=1 cm.

Since the chip area of a memory is approximately 1 cm² at the most and the proportion occupied by the memory area, i.e. array efficiency, is approximately 50%, if the pulse is applied for a very short duration of time as short as 10 nanoseconds, writing can be carried out substantially simultaneously in the upper and lower magnetoresistance effect elements C1, C2 even though the current pulse reciprocates.

That is, as shown in FIGS. 4A, 4B, 5A and 5B, substantially simultaneous writing has been confirmed to be possible by connecting the digit lines DL1, DL2 on and under the magnetoresistance effect elements C1, C2 to U-turn at one of the memory block.

Figures 5A, 5B:
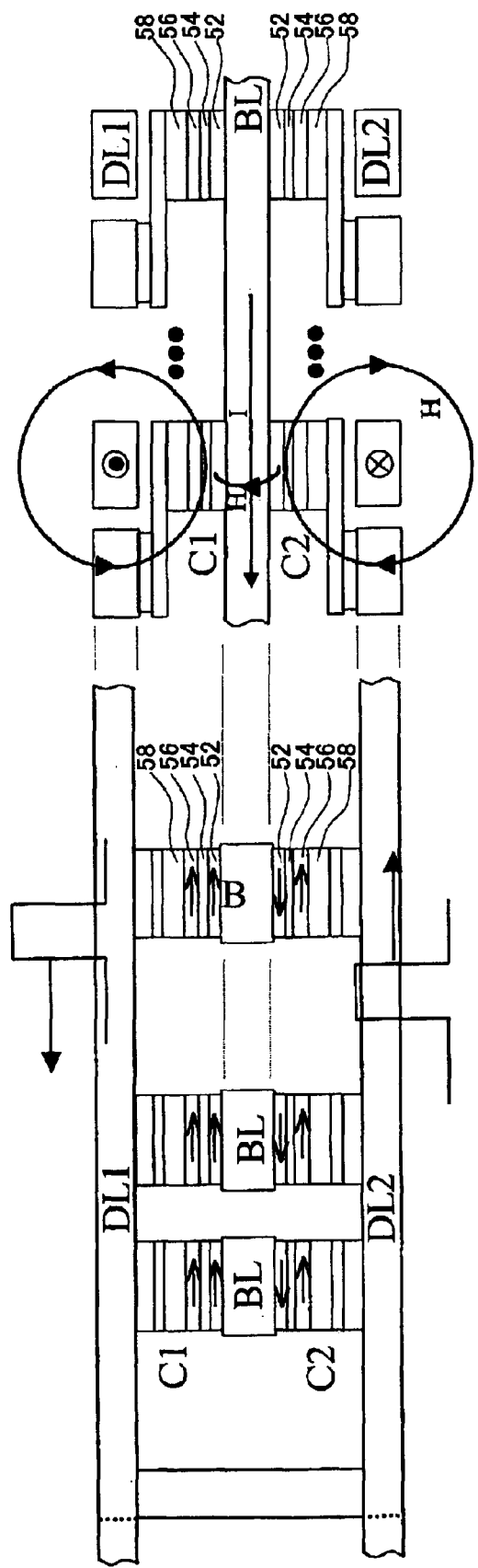
FIGS. 5A and 5B are schematic diagrams showing a wiring structure in which end portions of digit lines DL1, DL2" connected respectively on and under the magnetoresistance effect elements C1, C2 are connected together.
Figure 6:
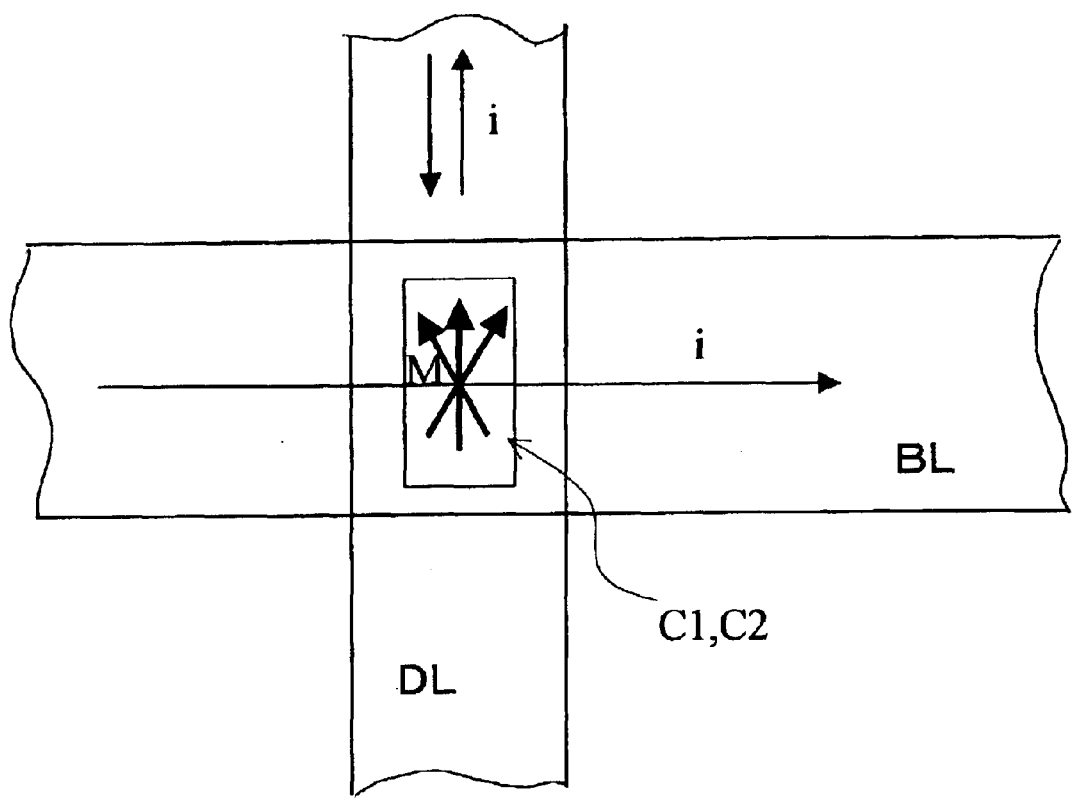
FIG. 6 is a transparent plan view schematically showing the reversal direction of magnetization M of a magnetic recording layer of the magnetoresistance effect element C1 interposed between a bit line BL and a digit line DL.

FIG. 6 is a plan view schematically showing the reversal direction of magnetization M of a magnetic recording layer of the magnetoresistance effect element C1 interposed between a bit line BL and a digit line DL1. Reversal direction of magnetization is reverted depending upon the direction of the current flowing in the digit lines. In case of the configuration shown in FIGS. 4A, 4B, 5A and 5B, reversal directions of magnetization M are different between the upper and lower magnetoresistance effect elements C1, C2. It is clockwise in one element and the counterclockwise in the other. However, this is immaterial because the asteroidal curve is approximately symmetric in both directions.

As explained heretofore with reference to FIGS. 4A through 6, when the digit lines DL1 and DL2 on and under the magnetoresistance effect elements C1, C2 are connected together, no increase of the current occurs even in the architecture of the differential amplification type, and no decrease of the capacity of the MRAM memory bit is invited by an increase of the power consumption and/or upsizing of the driver. Thus, high array efficiency is realized.

The embodiment also enables multi-valued recording when outputs of the upper and lower magnetoresistance effect elements C1, C2 are combined.

Figures 7A, 7B:
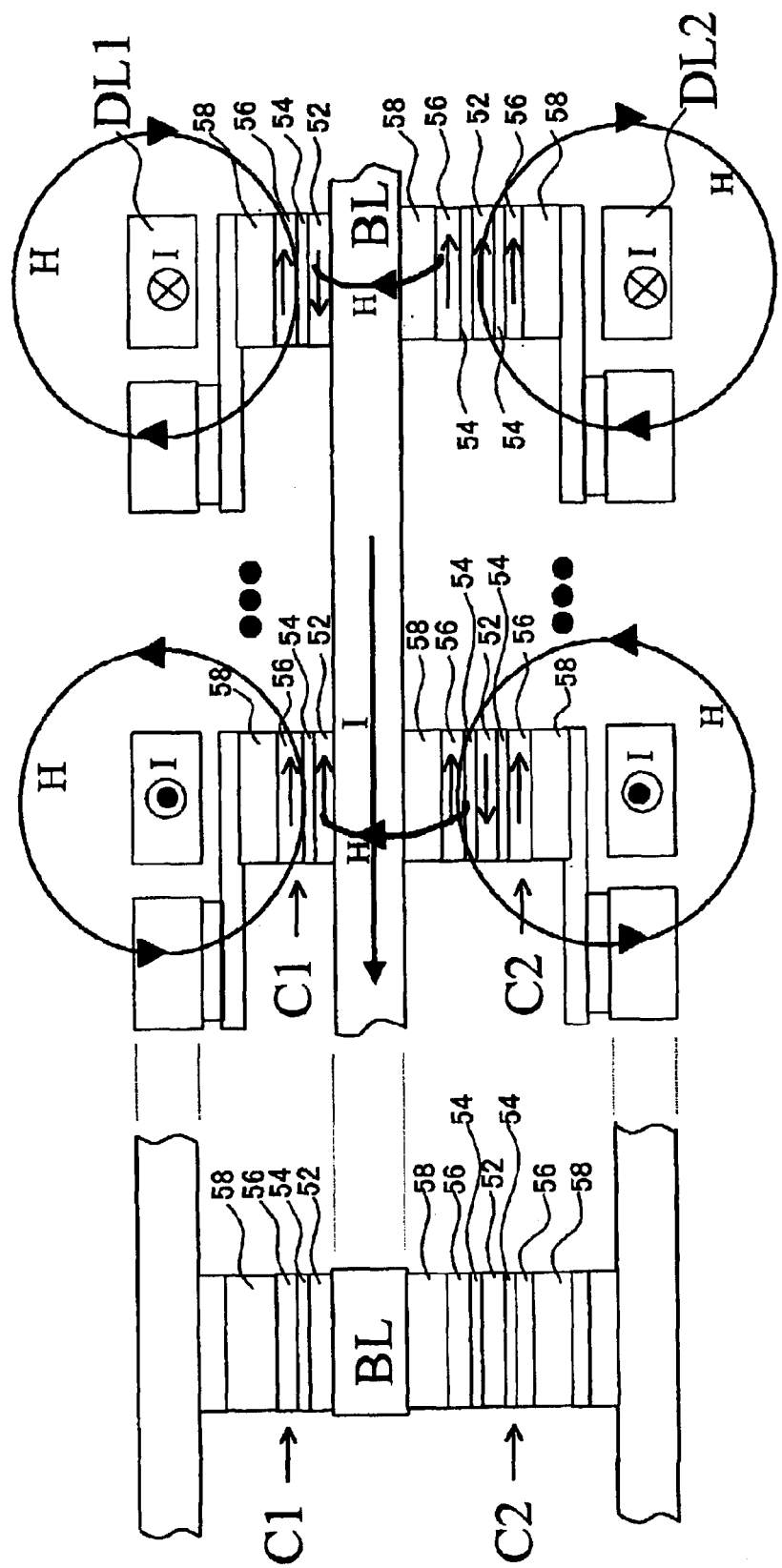
FIGS. 7A and 7B are schematic diagrams showing a multi-valued recording memory cell according to an embodiment of the invention.

FIGS. 7A and 7B are schematic diagrams showing a multi-valued recording memory cell according to an embodiment of the invention. FIG. 7A is a cross-sectional view taken along a plane perpendicular to the lengthwise direction of the bit line BL, and FIG. 7B is a cross-sectional view taken along a plane parallel to the lengthwise direction of the bit line BL.

For multi-valued recording, the device is configured to permit independent writing in the upper and lower magnetoresistance effect elements C1, C2, respectively. Then, a difference between their outputs is computed.

For example, assume that two outputs of the magnetoresistance effect elements C1, C2 are as follows.

|  | Anti-parallel | Parallel |
| --- | --- | --- |
| Output of C1 | A | B |
| Output of C2 | C | D |

In case the magnetoresistance effect elements C1, C2 are available for independent writing, there are the following four combinations as output differences obtained by deducting outputs of C1 from outputs of C2.

| C1 | C2 | Output difference |
| --- | --- | --- |
| Anti-parallel | Anti-parallel | (C-A) |
| Parallel | Anti-parallel | (C-B) |
| Anti-parallel | Parallel | (D-A) |
| Parallel | Parallel | (D-B) |

Therefore, when the outputs A through D of the upper and lower magnetoresistance effect elements C1, C2 are adjusted to appropriate values, those four kinds of output differences have significant differences, respectively, and four-valued information can be recorded and reproduced.

For the purpose of obtaining different outputs of the upper and lower magnetoresistance effect elements C1, C2 from each other, the specific example of FIGS. 7A and 7B employ different structures for the magnetoresistance effect elements. The upper magnetoresistance effect element C1 has a single ferromagnetic tunneling junction whereas the lower magnetoresistance effect element C2 has double ferromagnetic tunneling junctions. By employing different structures to form the pair of magnetoresistance effect elements from each other, it is possible to obtain different outputs and carry out stable multi-valued recording. Configuration of upper and lower magnetoresistance effect elements to vary their outputs is not limited to that shown in FIGS. 7A and 7B. Otherwise, the magnetoresistance effect elements may be different in multi-layered structure, or one or more of layers forming one of the magnetoresistance elements may be changed in material and/or thickness from those of such layers of the other magnetoresistance effect elements.

For multi-valued recording, it is required that the upper and lower magnetoresistance effect elements C1, C2 are available for independent recording. Therefore, as shown in FIGS. 7A and 7B, the easy axes of magnetization of the recording layers 52 are preferably parallel to the lengthwise direction of the bit line BL. That is, easy axes of magnetization of the recording layers 52 are oriented perpendicularly to the digit lines DL1, DL2. In this manner, when writing electric currents are supplied independently to the digit lines DL1, DL2, writing occurs independently in the upper and lower magnetoresistance effect elements C1, C2, and multi-valued recording is enabled.

Also in the architecture for multi-valued recording shown in FIGS. 7A and 7B, since electric currents are supplied to the upper and lower digit lines DL1, DL2, and current flowing in the digit lines is larger than that of ordinary architecture, and this is disadvantageous from the viewpoint of power consumption. Additionally, since a larger quantity of current must be supplied, the area of the driver for supplying the current to the digit lines inevitably increases. This invites the disadvantage that the ratio of the memory area relative to the chip area (array efficiency) decreases.

To overcome these problems, one of opposite ends of the digit line DL1 and an adjacent end of the digital line DL2, both extending substantially perpendicularly to the bit line BL in the vertical differential MRAM capable of recording multi-valued information, may be configured to selectively connected together as shown in FIGS. 8A through 11C. That is, the digit lines DL1, DL2 are connected together only when the switching element Tr1 is ON.

Here again, similarly to the reason already explained with reference to FIGS. 4A through 6, the reason why the multi-valued recording is possible lies in that the propagation speed of the current (electrons) flowing in the digit lines DL1, DL2 is very fast in the order of $10^8$ cm/second. As explained before, even when a very short pulse as short as 10 nanosecond, for example, is applied, a uniform current magnetic field is formed by the pulse in the space sized approximately 1 cm. This size is large enough to cover the memory area of an ordinary memory chip. Therefore, even when an extremely short writing pulse as short as 10 nanoseconds is used, writing can be carried out simultaneously in the upper and lower magnetoresistance effect elements C1, C2 by connecting the upper and lower digit lines DL1, DL2 together and reciprocating the current pulse.

In case of multi-valued recording, however, the switching element Tr1 must be appropriately turned on or off, depending upon the writing bit. That is, in accordance with the writing bit information, the upper and lower digit lines DL1, DL2 must be connected or disconnected.

Figure 8A:
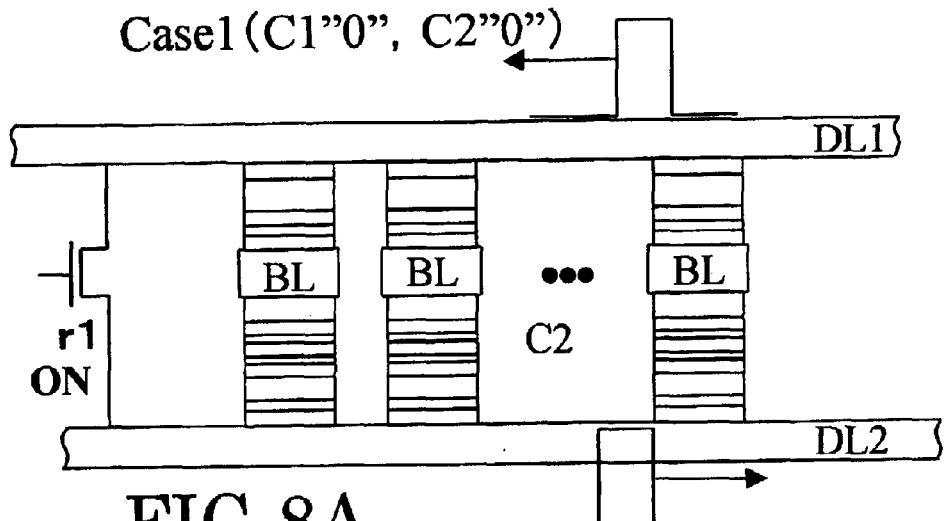
FIGS. 8A through 8C are schematic diagrams showing a wiring structure of vertically differential MRAM capable of recording multi-valued information, in which one set of opposite ends of two digit lines DL1, DL2 extending across bit lines BL can be connected via a switching element.
Figure 8B:
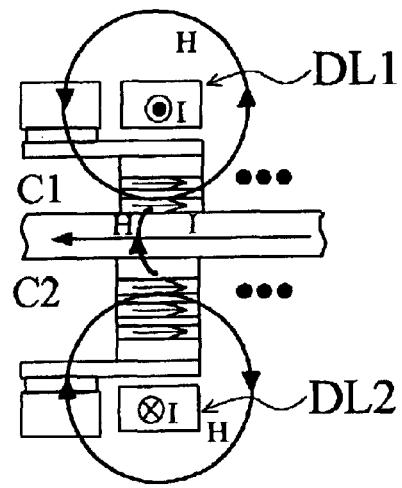
Figure 8C:
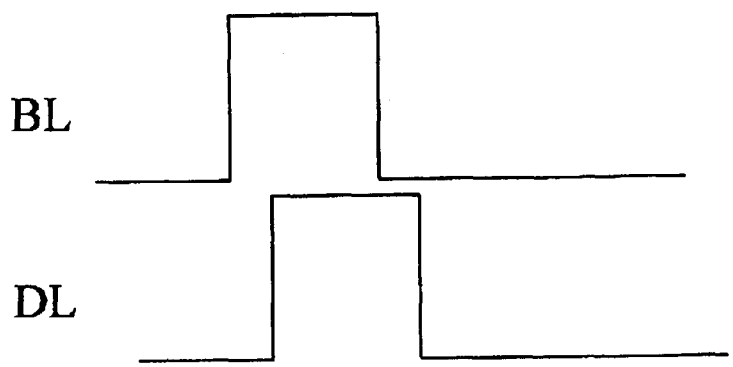

For example, in case of writing "0" in both of the upper and lower magnetoresistance effect elements C1, C2, the switching element Tr1 is turned on to connect the digit lines DL1, DL2 as shown in FIG. 8A. Then, a writing pulse is applied from a power source connected to one end of the digit line DL1, for example, and it is permitted to flow into the digit line DL2. The writing timing is as shown in FIG. 8A. That is, at substantially the same timing as the application of the writing pulse to the bit line BL, the switching element Tr1 is turned on to let the writing pulse flow into the digit lines DL1, DL2 as well.

Figure 9A:
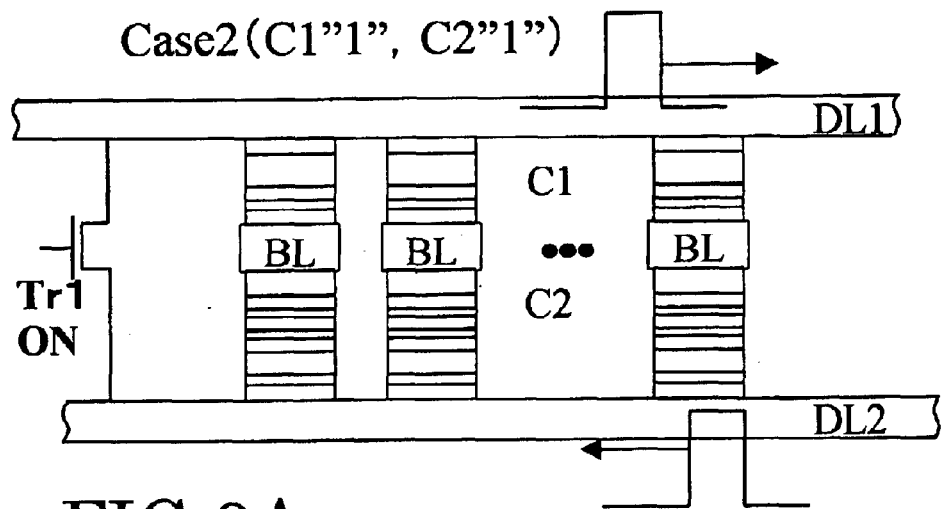
FIGS. 9A through 9C are schematic diagrams showing a wiring structure of vertically differential MRAM capable of recording multi-valued information, in which one set of opposite ends of two digit lines DL1, DL2 extending across bit lines BL can be connected via a switching element.
Figure 9B:
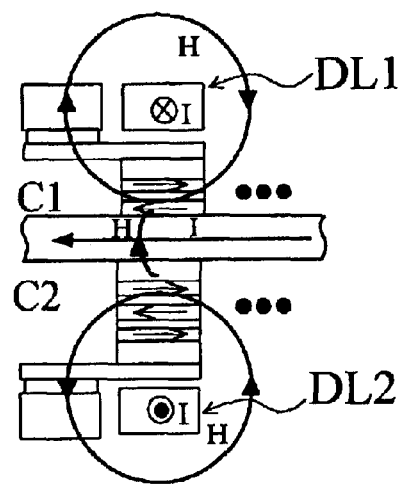
Figure 9C:
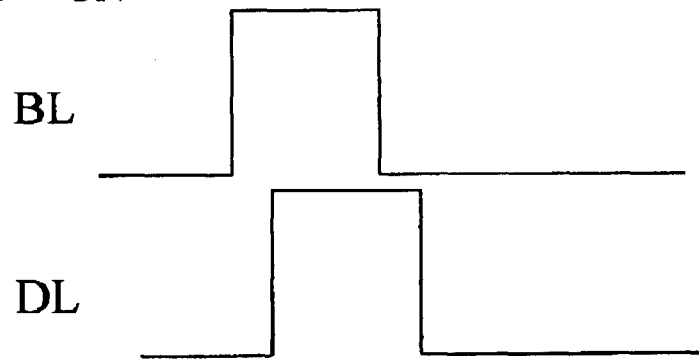

Also when "1" is written in the upper and lower magnetoresistance effect elements C1, C2, respectively, substantially the same operations occur. As shown in FIG. 9A, the switching element Tr1 is turned on to connect the upper and lower digit lines DL1, DL2 together. Then a writing pulse is applied from the power source connected to one end of the digit line DL2, for example, and it is permitted to flow into the digit line DL1 as well. Here again, the writing timing is as shown in FIG. 9C. The switching element Tr1 is turned on substantially at the same timing as the application of the writing pulse to the bit line BL to permit the writing pulse to flow into the digit lines DL1, DL2 as well.

In contrast, in case of writing "0" in one of the upper and lower magnetoresistance effect elements C1, C2 and "1" in the other, the upper and lower digit lines DL1, DL2 must be disconnected.

Figure 10A:
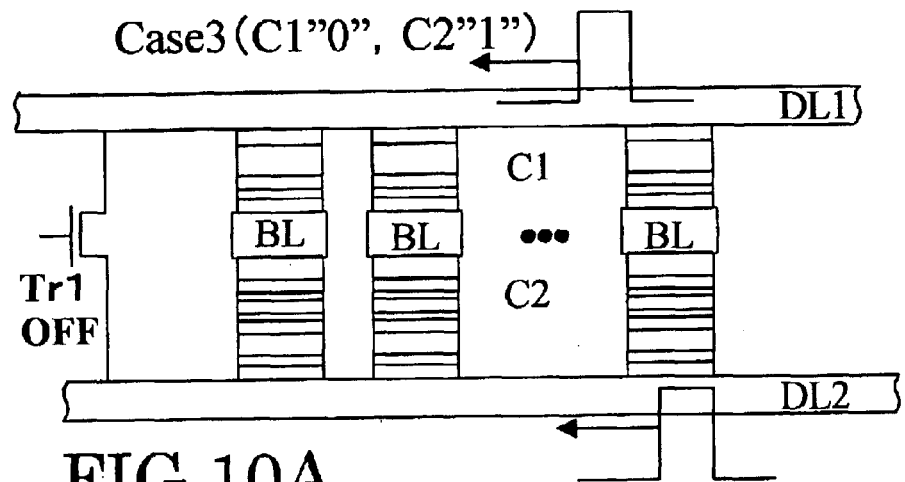
FIGS. 10A through 10C are schematic diagrams showing a wiring structure of vertically differential MRAM capable of recording multi-valued information, in which one set of opposite ends of two digit lines DL1, DL2 extending across bit lines BL can be connected via a switching element.
Figure 10B:
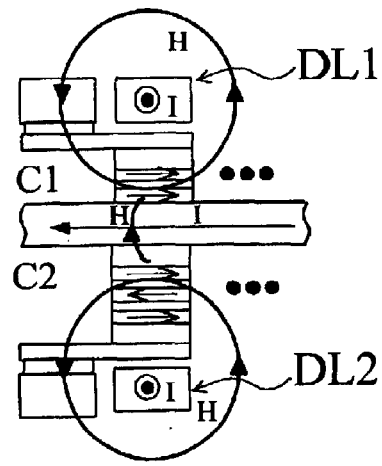

For example, as shown in FIG. 10A, in case of writing "0" in the upper magnetoresistance effect element C1 having a single ferromagnetic tunneling junction and writing "1" in the lower magnetoresistance effect element C2 having double ferromagnetic tunneling junctions, the switching element Tr1 is turned off to disconnect the digit lines DL1, DL2. Then writing pulses are supplied in the same direction from power sources connected to respective ends of the digit lines DL1, DL2.

Figure 10C:
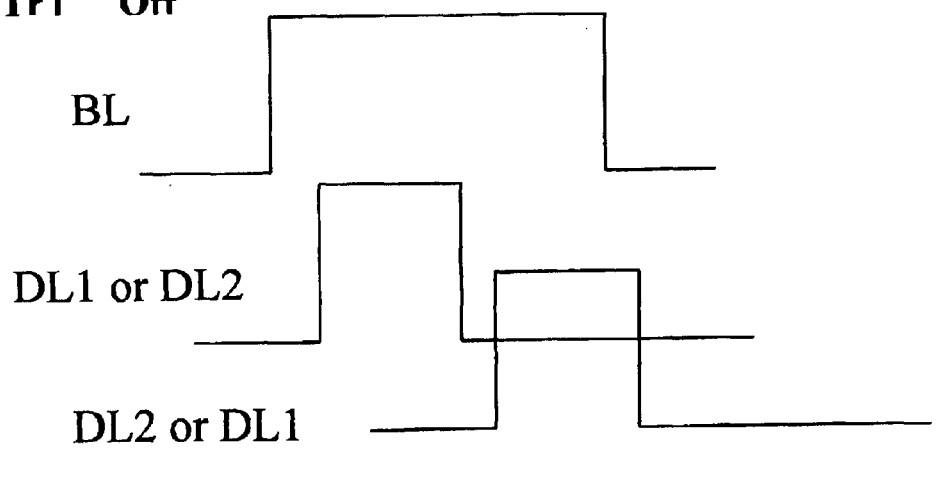

The writing timing in this case is as shown in FIG. 10C. The switching element Tr1 is turned off substantially at the same timing as the application of the writing pulses to the bit line BL to permit the writing pulses to flow into the digit lines DL1, DL2, respectively. In this case, however, to supply current pulses from a single power source (not shown) to the upper and lower magnetoresistance effect elements, respectively, the writing timing must be offset as shown in FIG. 10C. That is, after the writing current pulse is first supplied to one of the digit lines DL1, DL2 by connecting the power source thereto, power source is switched to the other digit line to supply the writing pulse thereto.

When data is written in the upper and lower magnetoresistance effect elements C1, C2, if the data then intended to record is the same as the data already stored, new writing need not be carried out. It is possible to omit the writing when the data intended to write is confirmed to be the same as the data already stored in the magnetoresistance effect element C1 or C2 by previously reading and checking it, for example.

The switching element Tr1 is held in OFF state at least until the current pulses are actually supplied to the upper and lower digit lines DL1, DL2, respectively.

Figure 11A:
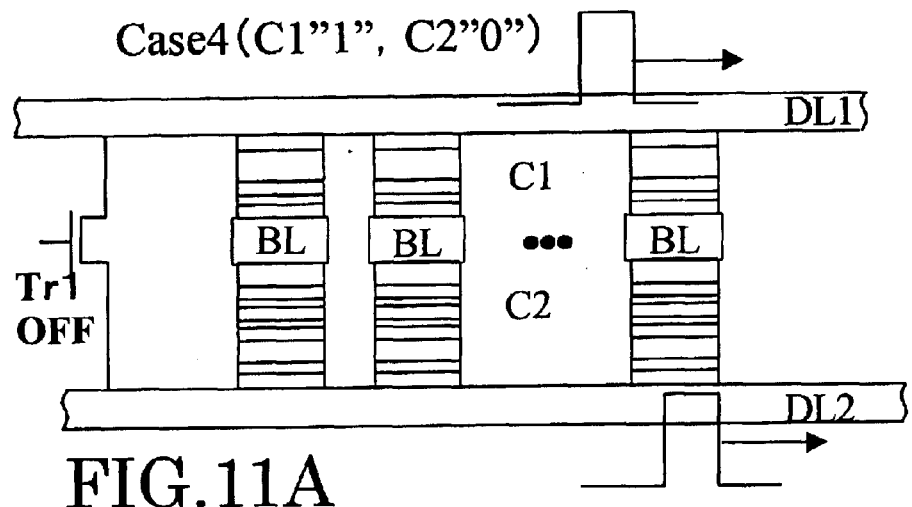
FIGS. 11A through 11C are schematic diagrams showing a wiring structure of vertically differential MRAM capable of recording multi-valued information, in which one set of opposite ends of two digit lines DL1, DL2 extending across bit lines BL can be connected via a switching element.
Figure 11B:
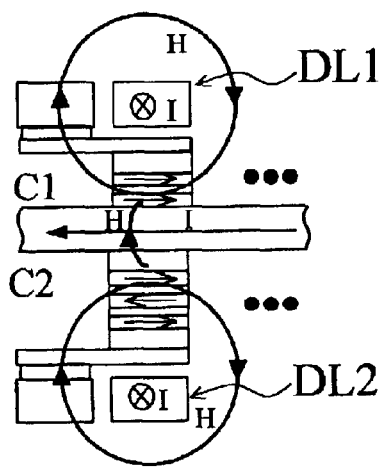
Figure 11C:
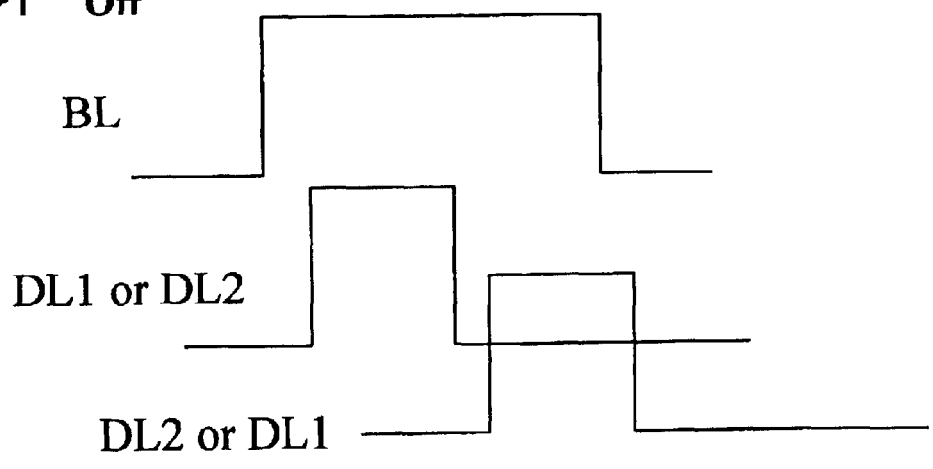

In case of writing "1" in the upper magnetoresistance effect element C1 having a single ferromagnetic tunneling junction and writing "0" in the lower magnetoresistance effect element C2 having double ferromagnetic tunneling junctions, the switching element Tr1 is here again turned off as shown in FIG. 11. Then writing pulses in the same direction may be supplied the respective digit lines DL1, DL2 by switching the power source thereto.

As explained heretofore with reference to FIGS. 8A through 11C, by configuring the upper and lower digit lines DL1, DL2 to be selectively connected and disconnected and the power source to be selectively connected, no increase of the current occurs even in the architecture of the differential amplification type, and no decrease of the capacity of the MRA memory bit is invited by an increase of the power consumption and/or upsizing of the driver.

Next explained is a specific example of multi-layered configuration of magnetoresistance effect elements usable in a magnetic memory according to an embodiment of the invention.

Figure 12:
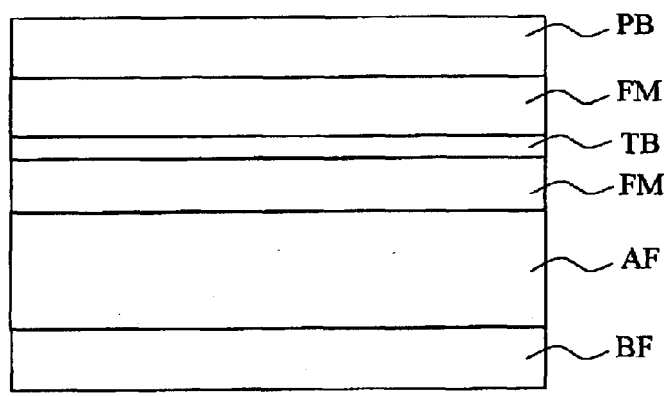
FIG. 12 is a schematic diagram showing a cross-sectional structure of a magnetoresistance effect element having a single ferromagnetic tunneling junction.
Figure 13:
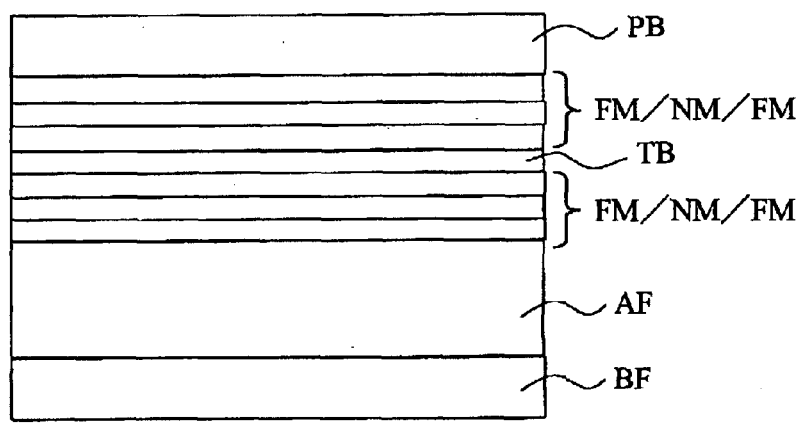
FIG. 13 is a schematic diagram showing a cross-sectional structure of a magnetoresistance effect element having a single ferromagnetic tunneling junction.

FIG. 12 and FIG. 13 are schematic diagrams showing cross-sectional structures of magnetoresistance effect elements having a single ferromagnetic tunneling junction.

In case of the magnetoresistance effect element shown in FIG. 12, an anti-ferromagnetic layer AF, ferromagnetic layer FM1, tunneling barrier layer TB, ferromagnetic layer FM2, and protective layer PB are stacked in the written order. The ferromagnetic layer FM 1 adjacent to the anti-ferromagnetic layer AF functions as the magnetically pinned layer (pinned layer), and the ferromagnetic layer FM2 overlying the tunneling barrier layer TB functions as the recording layer (free layer).

In case of the magnetoresistance effect element of FIG. 13, multi-layered films SL each including a ferromagnetic layer FM, nonmagnetic layer NM and ferromagnetic layer FM are formed on and under a tunneling barrier layer TB. Here again, the multi-layered film SL interposed between the anti-ferromagnetic layer AF and the tunneling barrier layer TB functions as the magnetically pinned layer, and the multi-layered film SL overlying the tunneling barrier layer TB functions as the recording layer.

Figure 14:
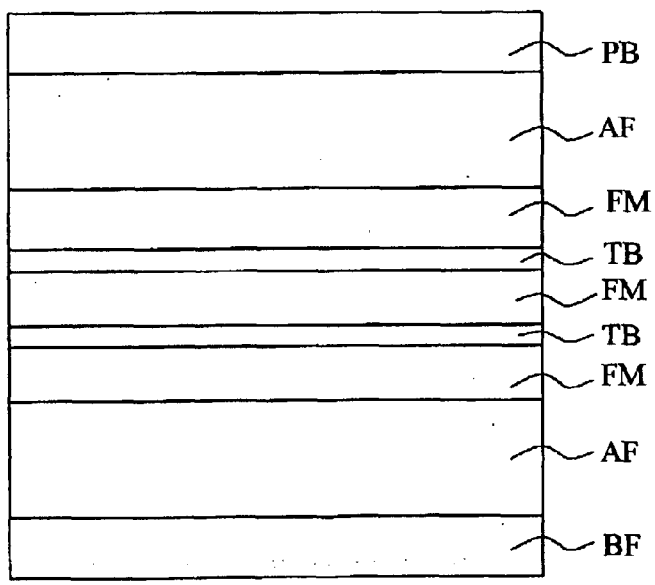
FIG. 14 is a schematic diagram showing a cross-sectional structure of a magnetoresistance effect element having double ferromagnetic tunneling junctions.
Figure 15:
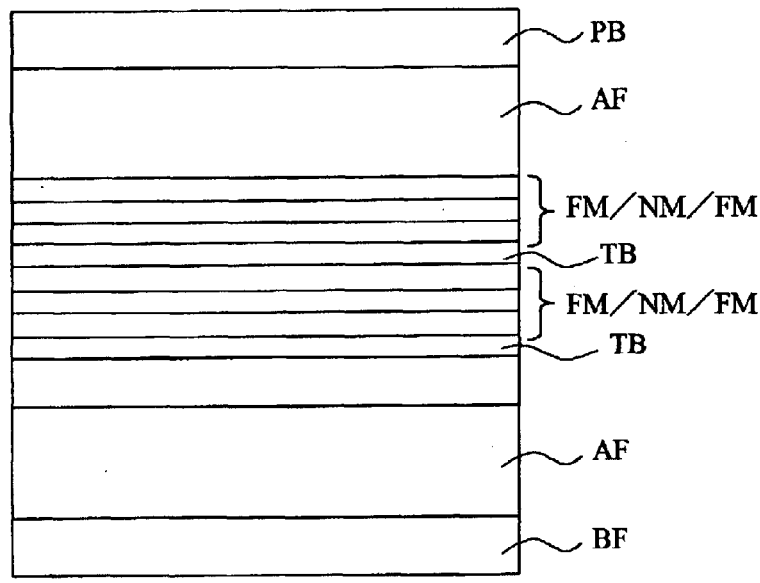
FIG. 15 is a schematic diagram showing a cross-sectional structure of a magnetoresistance effect element having double ferromagnetic tunneling junctions.
Figure 16:
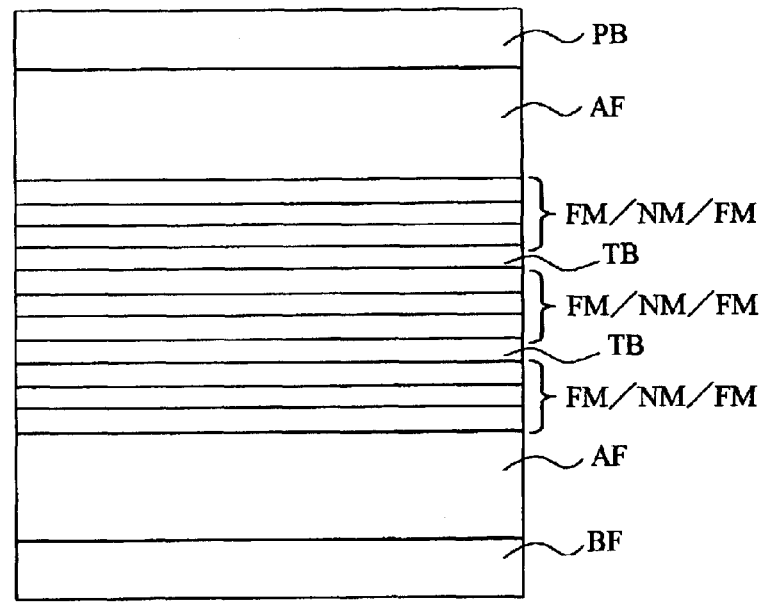
FIG. 16 is a schematic diagram showing a cross-sectional structure of a magnetoresistance effect element having double ferromagnetic tunneling junctions.

FIGS. 14 through 16 are schematic diagrams showing cross-sectional structures of magnetoresistance effect elements each having double ferromagnetic tunneling junctions. In these figures, the same or equivalent components as those already explained with reference to FIGS. 12 and 13 are labeled with common reference numerals, and their detailed explanation is omitted.

In case of the structures shown in FIGS. 14 through 16, each includes two tunneling barrier layers TB, and ferromagnetic layers FM or multi-layered films SL each including a ferromagnetic layer FM and a nonmagnetic layer NM are formed to overlie and underlie the ferromagnetic layer FM. In each of the double-tunneling elements shown here, the ferromagnetic layers FM or multi-layered films adjacent to the top and bottom of the ferromagnetic layer AF function as magnetically pinned layers, and ferromagnetic layers FM or multi-layered films SL interposed between two tunneling barrier layers TB function as recording layers.

The use of such a double-tunneling structure is advantageous for obtaining large changes of a current relative to the magnetization directions of the recording layers.

Magnetoresistance effect elements usable in a magnetic memory according to an embodiment of the invention are not limited to those shown in FIGS. 12 through 16. A magnetoresistance effect element having a so-called "spin valve" structure made by stacking a first ferromagnetic layer, nonmagnetic layer and second ferromagnetic layer can be used as well.

Whichever of these structures is employed as the magnetoresistance effect element, one of the ferromagnetic layers can be used to function as the "magnetically pinned layer (also called "pinned layer") substantially pinned in magnetization direction, and the other ferromagnetic layer can be used to function as the "magnetic recording layer" variable in magnetization direction with an externally applied magnetic field.

Additionally, the ferromagnetic layer adjacent to the anti-ferromagnetic layer can be used as a recording layer in case a certain reading system is employed as explained later in greater detail.

Ferromagnetic materials usable as the magnetically pinned layers in these magnetoresistance effect elements are, for example, Fe (iron), Co (cobalt), Ni (nickel), their alloys, magnetite having large spin polarizability, oxides such as $CrO_2$, $RXMnO_{3-y}$ (where R is a rare earth and X is one of Ca (calcium), Ba (barium) and Sr (strontium)), and Heusler alloys such as NiMnSb (nickel manganese antimony) and PtMnSb (platinum manganese antimony).

The magnetically pinned layer made of such a material preferably has unidirectional anisotropy. Its thickness is preferably in the range from 0.1 nm to 100 nm. This ferromagnetic layer must be thick enough to prevent itself from becoming super-paramagnetic, and it is more preferably not thinner than 0.4 nm.

An anti-ferromagnetic film is preferably added to the ferromagnetic layer used as the magnetically pinned layer to pin the magnetization. As anti-ferromagnetic films of this type, there are Fe (iron)-Mn (manganese), Pt (platinum)-Mn (manganese), Pt platinum)-Cr (chromium)-Mn (manganese), Ni (nickel)-Mn (manganese), Ir (iridium)-Mn (manganese), NiO (nickel oxide), $Fe_2O_3$ (iron oxide) and the above-mentioned magnetic semiconductors, These magnetic materials may be adjusted in magnetic property, or in other physical properties such as crystalline property, mechanical property and chemical property, for example, by addition of one or more nonmagnetic elements such as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium) and H (hydrogen), for example.

On the other hand, a multi-layered film of a ferromagnetic layer and a nonmagnetic layer may be used as the magnetically pinned layer. For example, the three-layered structure of ferromagnetic layer/nonmagnetic layer/ferromagnetic layer as shown in FIG. 13 can be used. In this case, it is desirable that anti-ferromagnetic interaction works between the ferromagnetic layers in opposite sides of the nonmagnetic layer.

More specifically, as a method of pinning the magnetic layer in one direction, it is desirable to use a three-layered film such as Co (Co—Fe)/Ru (ruthenium)/Co (CoFe), Co (Co—Fe)/Ir (iridium)/Co (Co—Fe), Co (Co—Fe)/Os (osmium)/Co (Co—Fe), magnetic semiconductor ferromagnetic layer/magnetic semiconductor nonmagnetic layer/magnetic semiconductor ferromagnetic layer as the magnetically pinned layer, and additionally form an anti-ferromagnetic film adjacent thereto.

Here again, as the anti-ferromagnetic film, Fe—Mn, Pt—Mn, Pt—Cr—Mn, Ni—Mn, Ir—Mn, NiO, $Fe_2O_3$, magnetic semiconductor, etc. can be used similarly to those mentioned above. The use of this structure contributes to firmly pinning the magnetization of the magnetically pinned layer, and additionally to decreasing (or adjusting) the stray field from the magnetically pinned layer. Therefore, by changing two ferromagnetic layers of the magnetically pinned layer in thickness, magnetization shift of the magnetic recording layer can be adjusted.

On the other hand, also as the material of the magnetic recording layer (free layer) similarly to the magnetically pinned layer, it is possible to use Fe (iron), Co (cobalt), Ni (nickel), their alloys, magnetite having large spin polarizability, oxides such as $CrO_2$, $RXMnO_{3-y}$ (where R is a rare earth and X is one of Ca (calcium), Ba (barium) and Sr (strontium)), and Heusler alloys such as NiMnSb (nickel manganese antimony) and PtMnSb (platinum manganese antimony).

The ferromagnetic layer as the magnetic recording layer made of such a material preferably has unidirectional anisotropy in the direction substantially in parallel to the film plane. Its thickness is preferably in the range from 0.1 nm to 100 nm. This ferromagnetic layer must be thick enough to prevent itself from becoming super-paramagnetic, and it is more preferably not thinner than 0.4 nm.

As the magnetic recording layer, the two-layered structure of soft magnetic layer/ferromagnetic layer or the three-layered structure of ferromagnetic layer/soft magnetic layer/ferromagnetic layer may be used. When using the three-layered structure of ferromagnetic layer/nonmagnetic layer/ferromagnetic layer or the five-layered structure of ferromagnetic layer/nonmagnetic layer/ferromagnetic layer/nonmagnetic layer/ferromagnetic layer and controlling the interaction between the ferromagnetic layers, the favorable effect that the power consumption of the current magnetic field is prevented from increasing even when the cell width of the magnetic recording layer as the memory cell downsizes to a submicron or even smaller size. In case of the five-layered structure, the use of a soft magnetic layer or a ferromagnetic layer interrupted by nonmagnetic elements as the intermediate ferromagnetic layer is more preferable.

Also in the magnetic recording layer, these magnetic materials may be adjusted in magnetic property, or in other physical properties such as crystalline property, mechanical property and chemical property, for example, by addition of one or more nonmagnetic elements such as Ag (silver), Cu (copper), Au (gold), Al (aluminum), Mg (magnesium), Si (silicon), Bi (bismuth), Ta (tantalum), B (boron), C (carbon), O (oxygen), N (nitrogen), Pd (palladium), Pt (platinum), Zr (zirconium), Ir (iridium), W (tungsten), Mo (molybdenum), Nb (niobium) and H (hydrogen), for example.

These compounds need not be completely precise in composition from the stoichiometrical viewpoint, but hydrogen, nitrogen or fluorine, for example, may be short or excessive. This insulating layer (dielectric layer) had better be thin enough to permit a tunneling current to flow. Practically, it is preferably controlled not to exceed 10 nm.

The magnetoresistance effect element having the above-explained configuration can be made on a predetermined substrate by using a usual method for fabricating thin films, such as various kinds of sputtering, vapor deposition, molecular beam epitaxy and CVD, for example. As this substrate, various kinds of substrates are usable, such as Si (silicon), $SiO_2$ (silicon oxide), $Al_2O_3$ (aluminum oxide), spinel, AlN (aluminum nitride), GaAs and GaN, for example.

Additionally, a layer of Ta (tantalum), Ti (titanium), Pt (platinum), Pd (palladium), Au (gold), Ti (titanium)/Pt (platinum), Ta (tantalum)/Pt (platinum), Ti (titanium)/Pd (palladium), Ta (tantalum)/Pd (palladium), Cu (copper), Al (aluminum), Cu (copper), Ru (ruthenium), Ir (iridium), Os (osmium), or semiconductor base such as GaAs, GaN, ZnO and $TiO_2$ may be formed on the substrate as the base layer or protective layer.

Heretofore, the multi-layered structure of the magnetoresistance effect element to be used in the magnetic memory according to the embodiment of the invention has been explained.

Direction of magnetization written in the magnetic recording layers of the magnetoresistance effect elements C1, C2 need not be straight, and it may be curved to have "edge domains" in accordance with the plane geometry of the magnetic recording layers.

Figure 17A:
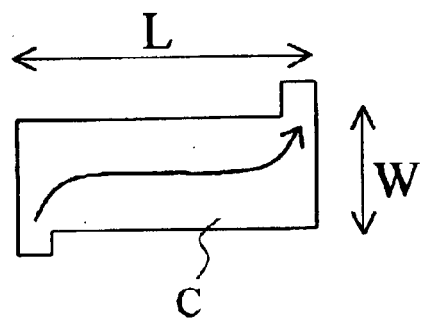
FIGS. 17A through 17F are schematic diagrams exemplifying plane geometries and corresponding directions of magnetization of magnetic recording layers of magnetoresistance effect elements.
Figure 17B:
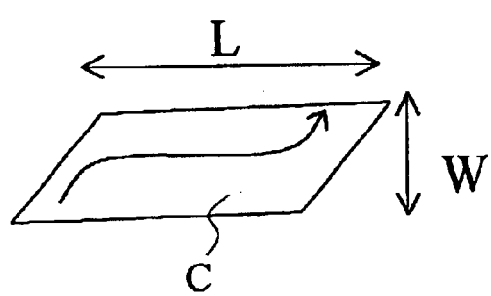
Figure 17C:
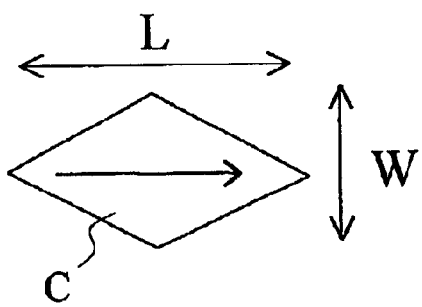
Figure 17D:
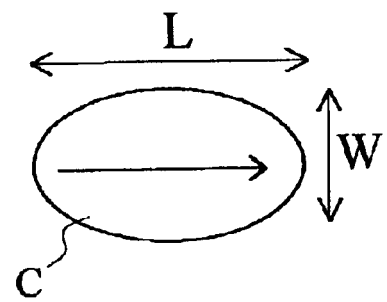
Figure 17E:
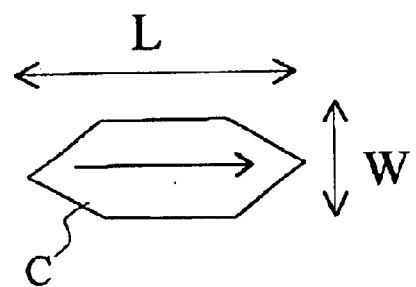
Figure 17F:
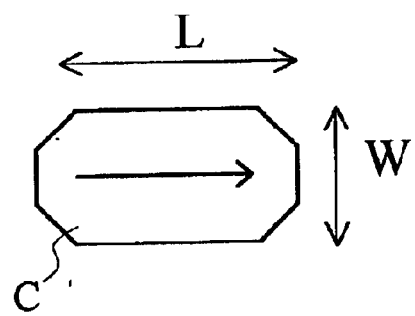

FIGS. 17A through 17F are schematic diagrams exemplifying plane geometries and corresponding directions of magnetization of magnetic recording layers of magnetoresistance effect elements. That is, the magnetic recording layer of the magnetoresistance effect element may have a rectangular shape added with projections at diagonal opposite ends as shown in FIG. 17A, parallelogrammatic shape as shown in FIG. 17B, rhomboidal shape as shown in FIG. 17C, elliptical shape as shown in FIG. 17D, edge-slanted shape as shown in FIG. 17E, an elongated octagon as shown in FIG. 11F, or any of other various shapes. In case of asymmetric shapes as shown in FIGS. 17A and 17B, direction of magnetization is curved due to formation of "edge domains". Magnetic recording layers of these types may be used in the embodiment of the invention. These asymmetric shapes can be easily made by using an asymmetrically patterned reticle in lithography.

In case of patterning the magnetic recording layer to any of the shapes shown in FIGS. 17A through 17C, 17E and 17F, corners are practically rounded in most cases. Such shaped with rounded corners are also acceptable. The magnetic recording layer preferably has unidirectional anisotropy with which the direction of magnetization is substantially regulated in a direction along one axis. For this purpose, ratio L/D between the width W and the length L of the magnetic recording layer is preferably larger than 1.2 to easily make the unidirectional anisotropy along the length L.

Heretofore, the basic structure of the magnetic memory according to the embodiment of the invention and magnetoresistance effect elements used therein have been explained.

Next explained is the cell structure of the magnetic memory according to the embodiment of the invention with reference to specific examples.

Figure 18:
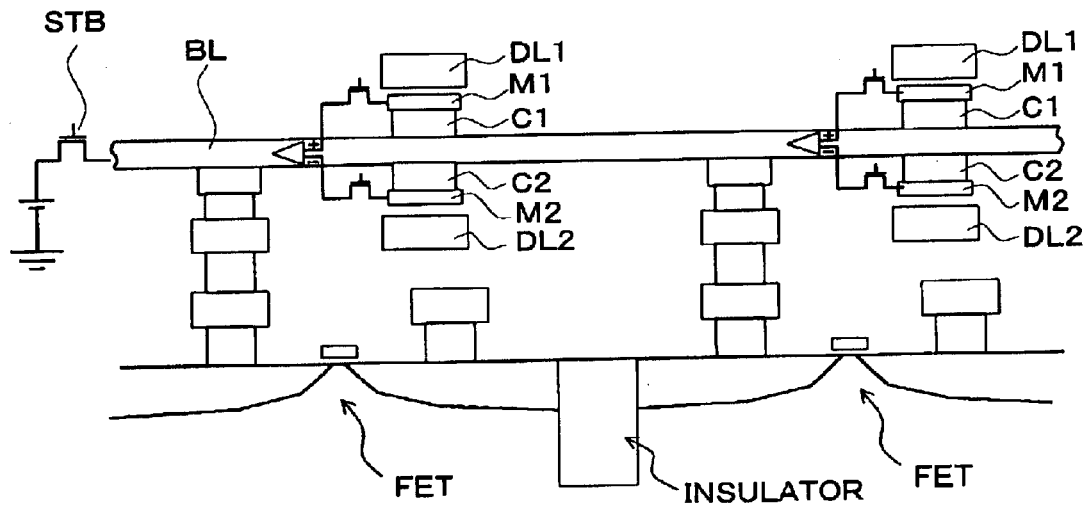
FIG. 18 is a diagram showing an architecture according to an embodiment of the invention when using CMOS.

FIG. 18 is a diagram showing an architecture according to an embodiment of the invention when using CMOS.

In case CMOS (complementary metal-oxide-semiconductor) is used as the switching element, for the reading purpose, the lower selection transistor CMOS is turned ON to flow a sense current to the respective magnetoresistance effect elements C1, C2 via the bit line BL, extract it from the read wiring M1, M2 and effect differential operation with the amplifier SA.

Writing in the magnetoresistance effect elements C1, C2 is carried out by flowing a writing current to the bit line BL and the digit lines DL1, DL2 that cross orthogonally. Then, as already explained in conjunction with FIGS. 3A to 4, by changing the easy axes of magnetization of the recording layers 52 of the magnetoresistance effect elements C1, C2, a memory of a differential operation type or a multi-valued memory type can be made.

To realize a still giant capacity memory, some memory arrays are preferably multi-layered by using an architecture available for this purpose.

Figure 19:
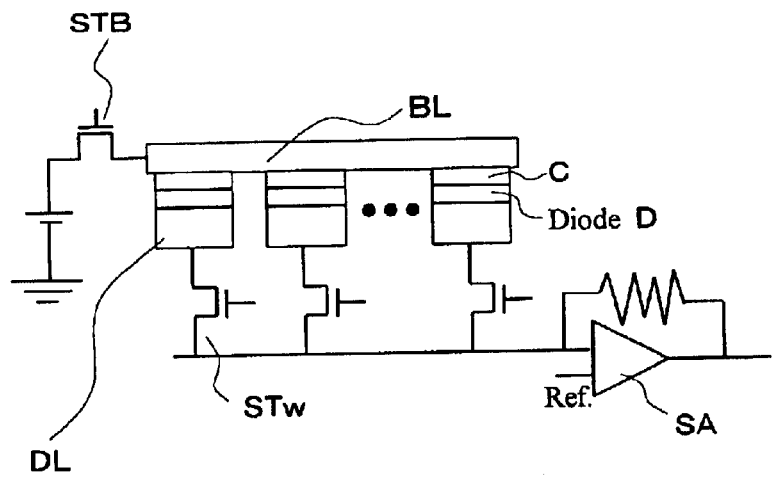
FIG. 19 is a schematic diagram the second specific example of the architecture usable in an embodiment of the invention.

FIG. 19 is a schematic diagram the second specific example of the architecture usable in an embodiment of the invention. This figure shows a cross-sectional structure of a memory array. In this architecture, magnetoresistance effect elements are connected in parallel to the read/write bit line BL. To the other end of each magnetoresistance effect element C, the read/write word line W is connected via a diode D.

For reading, a bit line BL and a digit line D connected to the target magnetoresistance effect element C are selected by a selection transistors STB and STw, and a current is detected by the sense amplifier SA.

For writing, a bit line BL and a digit line D connected to the target magnetoresistance effect element C are selected by a selection transistors STB and STw, and a writing current is flown. Then magnetic fields are generated in the bit line BL and the digit line DL, respectively, and their composite writing magnetic field directs the magnetization in the magnetic recording layer of the magnetoresistance effect element to a predetermined orientation. Thus the writing takes place.

The diode functions to interrupt a bypass current that flows via other magnetoresistance effect elements in a matrix array upon reading or writing.

Figure 20:
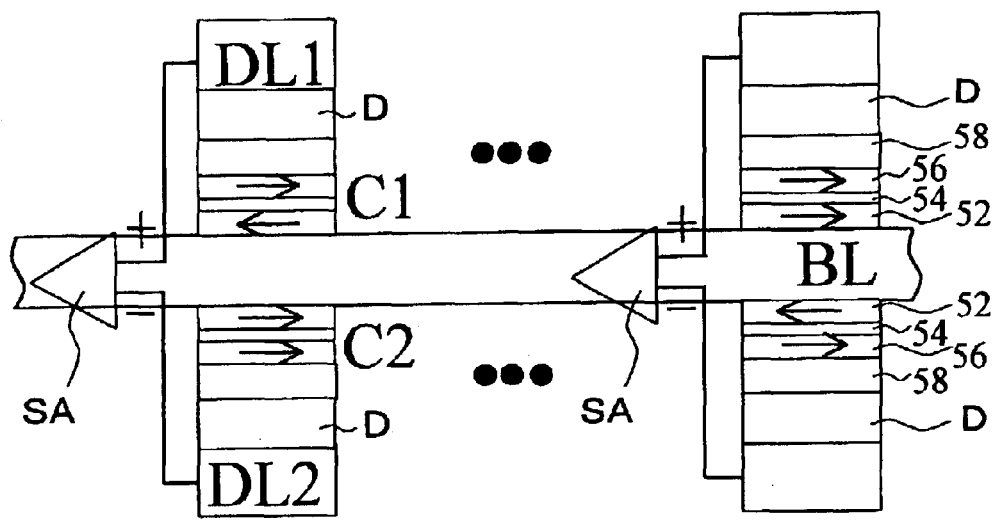
FIG. 20 is a cross-sectional schematic diagram showing a memory cell of a differential operation type made by using the architecture of FIG. 19.

FIG. 20 is a cross-sectional schematic diagram showing a memory cell of a differential operation type made by using the architecture of FIG. 19.

Figure 21A:
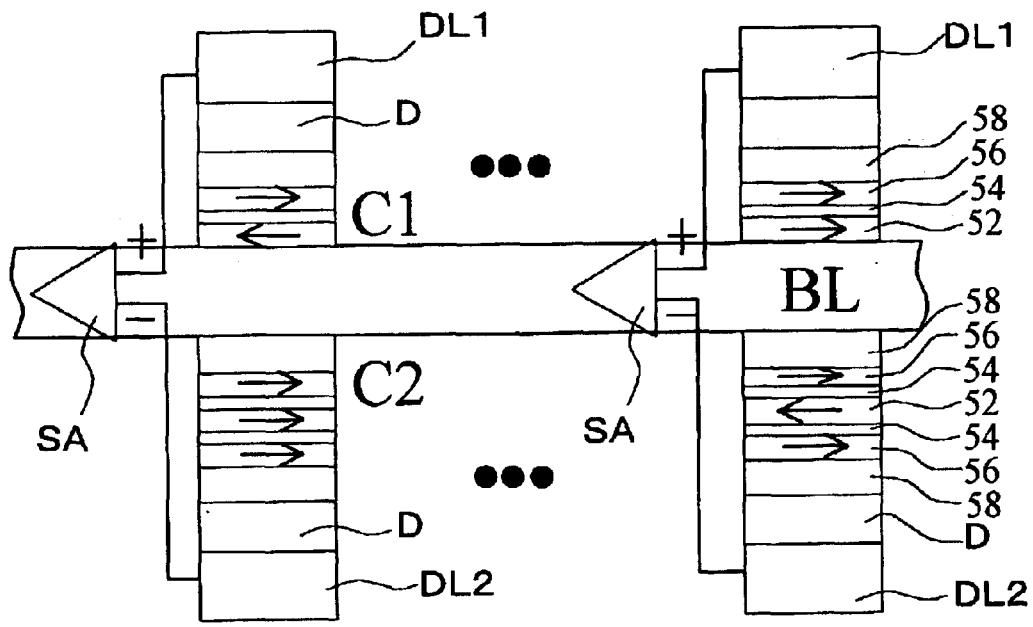
FIGS. 21A and 21B are cross-sectional schematic diagrams showing a memory cell of a multi-valued recording type made by using the architecture of FIG. 19.
Figure 21B:
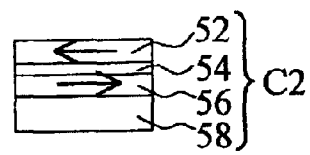

FIGS. 21A and 21B are cross-sectional schematic diagrams showing a memory cell of a multi-valued recording type made by using the architecture of FIG. 19.

For simplification, FIGS. 20 through FIG. 21B illustrates only a bit line BL, magnetoresistance effect elements C, diodes D and digit line DL and omits the other components from illustration. FIGS. 21A and 21B illustrate an example configured to change output voltages from each pair of magnetoresistance effect elements by constructing one of the magnetoresistance effect elements to have a single ferromagnetic tunneling junction and the other to have double ferromagnetic tunneling junctions. These memory cells are operative under the same operation principle as that already explained in conjunction with FIGS. 1 through 19.

The wiring (digit lines DL and bit line BL) is preferably made of Cu (copper), for example, and coated by an overcoat layer of a magnetic material as explained later. Usable magnetic materials for the overcoat layer are magnetic amorphous materials such as $FeO_x$ (iron oxide), CoZnNb (cobalt zinc niobate), and magnetic alloys such as CoFeNi (cobalt iron nickel), NiFe (nickel iron) and Permalloy (trademark).

FIGS. 21A illustrates the example configuring the upper magnetoresistance effect element C1 to have a single tunneling junction and the lower magnetoresistance effect element C2 to have double tunneling junctions to change their outputs and thereby facilitate multi-valued recording. Instead, however, an element having a single tunneling junction as shown in FIG. 21B may be used as the lower magnetoresistance effect element C2. In this case, material or thickness, for example, of a layer may be changed from that of the upper magnetoresistance effect element C1, to change its output from that of the magnetoresistance effect element C1. This makes multi-valued recording easy as well.

Next explained is the third specific example of architecture usable in the magnetic memory according to the embodiment.

FIG. 22 is a schematic diagram showing the third specific example of the architecture available for stacking memory arrays. That is, this figure shows a cross-sectional structure of a memory array.

In this architecture, a plurality of magnetoresistance effect elements C are connected in parallel between the read/write bit line BLw and the read bit line BLr in a "ladder" configuration. Additionally, the write word lines W extend across the bit lines.

Writing in the magnetoresistance effect element can be carried out by a composite magnetic field of a magnetic field generated in the read/write bit line BLw by flowing a write current and a magnetic field generated in the write digit line DL by flowing a write current, which acts on the magnetic recording layer of the magnetoresistance effect element.

For reading, a voltage is applied between the bit lines BLw and BLr. Then, currents flow in all magnetoresistance effect elements connected in parallel between them. While the sense amplifier SA detects the sum of these current, a write current is applied to the word line W close to the target magnetoresistance effect element. Thus the direction of magnetization in the magnetic recording layer of the target magnetoresistance effect element is changed to a predetermined direction. By detecting a change of the current occurring at this time, reading from the target magnetoresistance effect element can be attained.

That is, if the magnetization direction in the magnetic recording layer before writing is the same as the magnetization direction after writing, there is no change in the current detected by the sense amplifier SA. However, if the magnetization direction of the magnetic recording layer changes by writing, the current detected by the sense amplifier SA changes due to a magnetoresistance effect. In this manner, magnetization direction of the magnetic recording layer before writing, which is just the storage data, can be read out.

In contrast, in case the magnetoresistance effect element has the structure of magnetic layer/insulating layer (nonmagnetic layer)/magnetic recording layer, so-called "nondestructive reading" is possible. In case of using a magnetoresistance effect element of this type, direction of magnetization of the magnetic recording layer can be read out by recording the magnetization direction beforehand and appropriately changing the magnetization direction of the magnetic recording layer upon reading and thereby comparing sense currents. In this case, however, the element must be designed such that the magnetization reversal magnetic field of the magnetically free layer is larger than the magnetization reversal magnetic field of the magnetic recording layer.

FIG. 23A is a cross-sectional schematic diagram showing a memory cell of a differential operation type made by using the architecture of FIG. 22. FIG. 22B is a schematic diagram showing multi-layered structures of the magnetoresistance effect elements C1, C2. In a differential operation model, it is possible to the same output by designing the structures of the upper and lower magnetoresistance effect elements C1, C2 in this manner.

FIGS. 24A is a cross-sectional schematic diagram showing a memory cell of a multi-valued recording type made by using the architecture of FIG. 22. Also in FIGS. 23A through 24C, only the bit lines BL, magnetoresistance effect elements C and digit lines DL are shown, and the other components are omitted from illustration for simplicity. These memory cells are operative under the same operation principle as that already explained in conjunction with FIGS. 1 through 19.

Also in the memory cell shown in FIG. 24A, for the purpose of ensuring the pair of magnetoresistance effect elements C1, C2 to be different in output voltage, the magnetoresistance effect element C1 may have a single ferromagnetic tunneling junction and the other magnetoresistance effect element C2 may have double ferromagnetic tunneling junctions as shown in FIG. 24B. Alternatively, as shown in FIG. 24C, the lower magnetoresistance effect element C2 may have a single tunneling junction provided it is changed in material or thickness of at least one layer from that of the upper element C1 to supply an output different from that of C1.

Here again, the wiring (digit lines DL and bit line BL) is preferably made of Cu (copper), for example, and coated by an overcoat layer of a magnetic material as explained later. Usable magnetic materials for the overcoat layer are magnetic amorphous materials such as $FeO_x$ (iron oxide), CoZnNb (cobalt zinc niobate), and magnetic alloys such as CoFeNi (cobalt iron nickel), NiFe (nickel iron) and Permalloy (trademark).

Next explained is the third specific example of architecture usable in the magnetic memory according to the embodiment.

Figure 25:
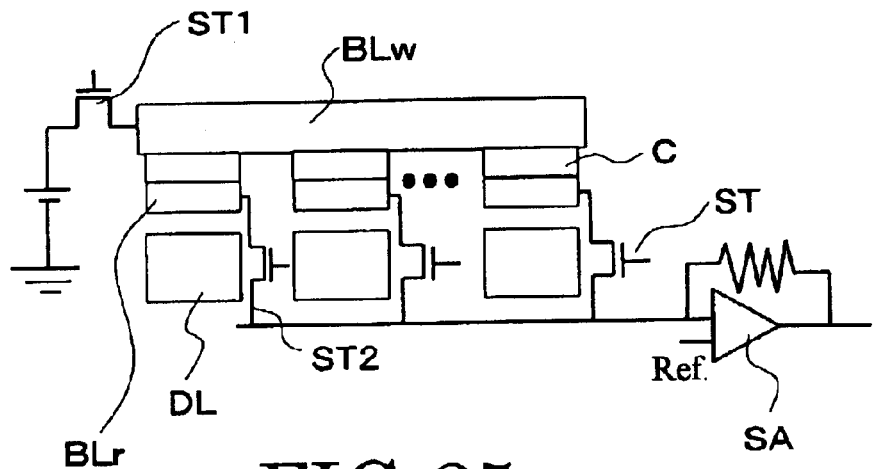
FIG. 25 is a schematic diagram showing the fourth specific example of the architecture available for stacking memory arrays.

FIG. 25 is a schematic diagram showing the fourth specific example of the architecture available for stacking memory arrays. That is, this figure shows a cross-sectional structure of a memory array.

In this architecture, a plurality of magnetoresistance effect elements are connected in parallel to the read/write bit lines BL, and read bit lines BLr are connected to the other ends of the magnetoresistance effect elements in a matrix arrangement.

Additionally, write digit lines DL extend closely to the read bit lines BLr.

Writing in a magnetoresistance effect element occurs when a composite magnetic field of a magnetic field generated in the read/write bit line BLw by flowing a write current and a magnetic field generated in the write digit line DL by flowing a write current acts on the magnetic recording layer of the magnetoresistance effect element.

For reading, bit lines BLw and BLr are selected by a selection transistor ST, and a sense current is flown to the target magnetoresistance effect element. Then the sense amplifier detects it.

Figure 26A:
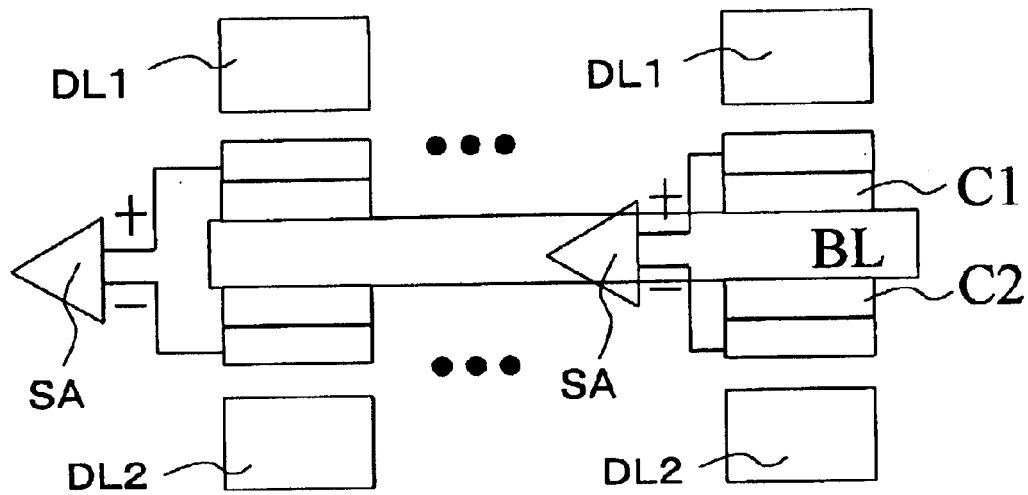
FIGS. 26A and 26B are cross-sectional schematic diagrams showing a memory cell of a differential operation type made by using the architecture of FIG. 25.
Figure 26B:
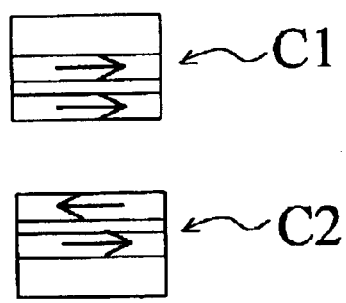

FIGS. 26A and 26B are cross-sectional schematic diagrams showing a memory cell of a differential operation type made by using the architecture of FIG. 25.

FIGS. 27A through 27C are cross-sectional schematic diagrams showing a memory cell of a multi-valued recording type made by using the architecture of FIG. 25. Also in FIGS. 26A through 27C, only the bit lines BL, magnetoresistance effect elements C and digit lines DL are shown, and the other components are omitted from illustration for simplicity. These memory cells are operative under the same operation principle as that already explained in conjunction with FIGS. 1 through 19.

Also in the memory cell shown in FIG. 27A, for the purpose of obtaining different output voltages from the pair of magnetoresistance effect elements C1, C2, a single ferromagnetic junction is formed in the magnetoresistance effect element C1 and double ferromagnetic tunneling junctions are formed in the other magnetoresistance effect element C2 as shown in FIG. 27B. Alternatively, as shown in FIG. 27C, the lower magnetoresistance effect element C2 may have a single tunneling junction provided it is changed in material or thickness of at least one layer from that of the upper element C1 to supply an output different from that of C1.

The foregoing explanation explained in conjunction with FIGS. 19 through 24C about the material of the wiring (digit lines DL and bit line BL) and the overcoat around them is applicable here again.

Next explained is the fifth specific example of architecture usable in the magnetic memory according to the embodiment.

Figure 28:
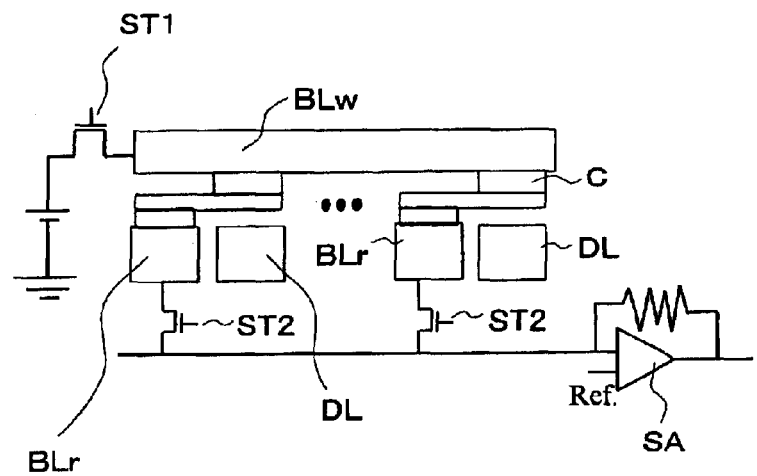
FIG. 28 is a schematic diagram the fifth specific example of the architecture usable in an embodiment of the invention.

FIG. 28 is a schematic diagram the fifth specific example of the architecture usable in an embodiment of the invention. This figure shows a cross-sectional structure of a memory array. This is different from other specific examples in that the read bit line BLr is connected to the magnetoresistance effect elements and the write digit line lie immediately under the magnetoresistance effect elements. In this configuration, the magnetoresistance effect elements and the digit lines can be located closer than the configuration of FIG. 25. As a result, the write magnetic field from the digit line can be invited to act on the magnetoresistance effect element more effectively.

Figure 29:
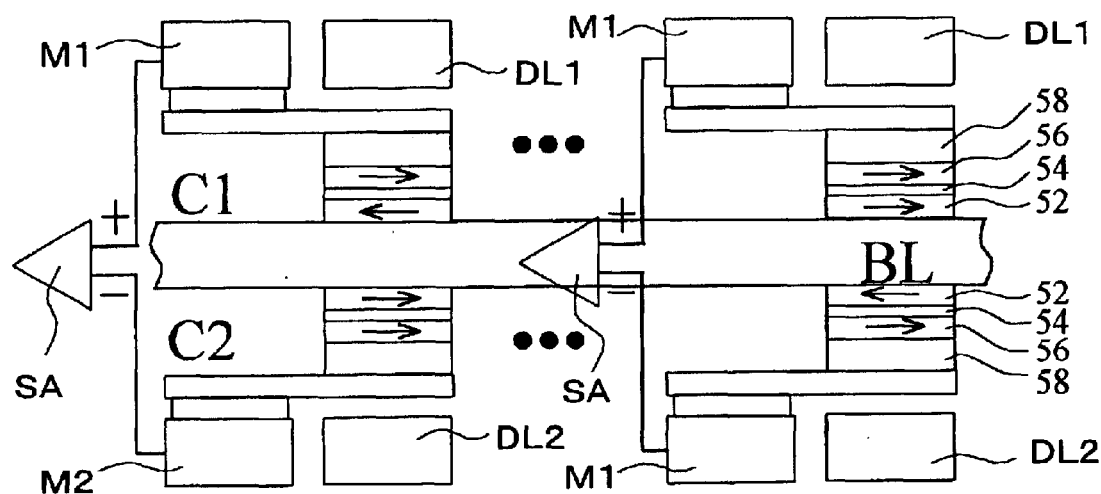
FIG. 29 is a cross-sectional schematic diagram showing a memory cell of a differential operation type made by using ferromagnetic single-tunneling elements as the magnetoresistance effect elements C1, C2 in the architecture of FIG. 28.
Figure 30:
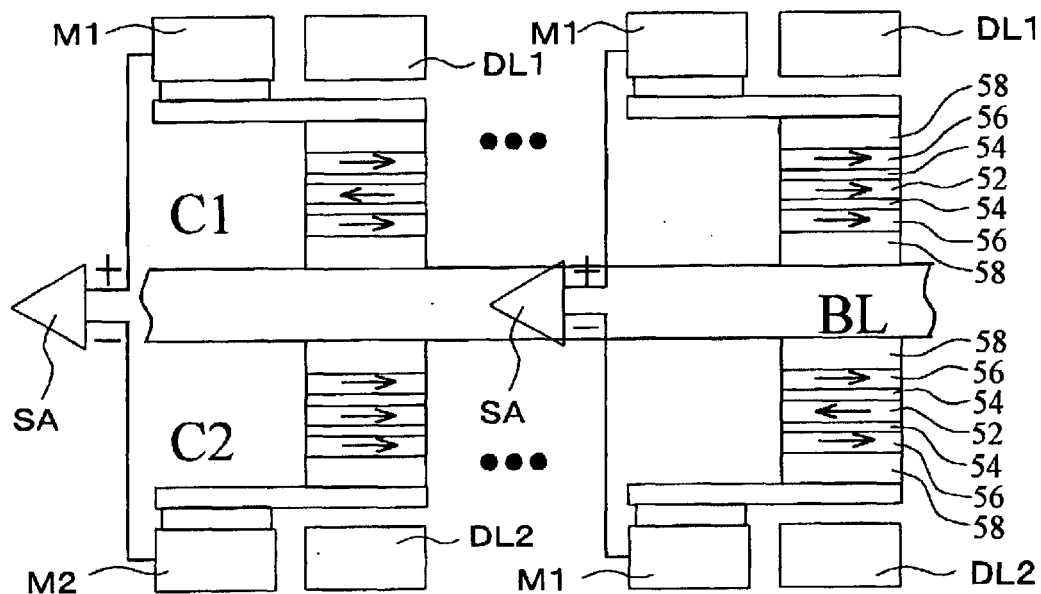
FIG. 30 is a cross-sectional schematic diagram showing a memory cell of a differential operation type made by using ferromagnetic double-tunneling elements as the magnetoresistance effect elements C1, C2 in the architecture of FIG. 28.
Figure 31:
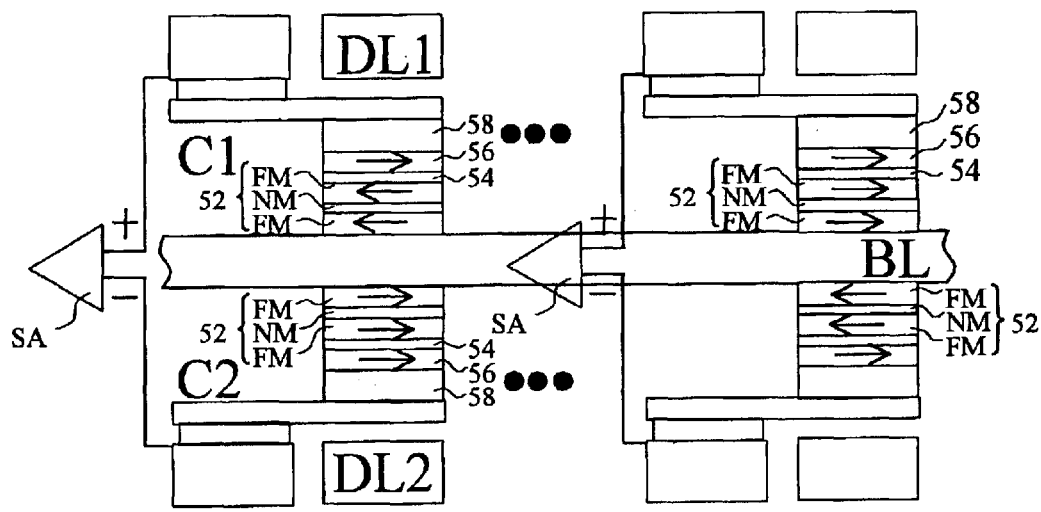
FIG. 31 is a cross-sectional schematic diagram showing a memory cell of a differential operation type made by using ferromagnetic single-tunneling elements as the magnetoresistance effect elements C1, C2 and using a three-layered structure of a ferromagnetic layer FM, nonmagnetic layer NM and ferromagnetic layer FM as the recording layer in the architecture of FIG. 28.

FIGS. 29 through 31 are cross-sectional schematic diagrams showing memory cells of differential operation types made by using ferromagnetic single-tunneling elements as the magnetoresistance effect elements C1, C2 in the architecture of FIG. 28.

Figure 32A:
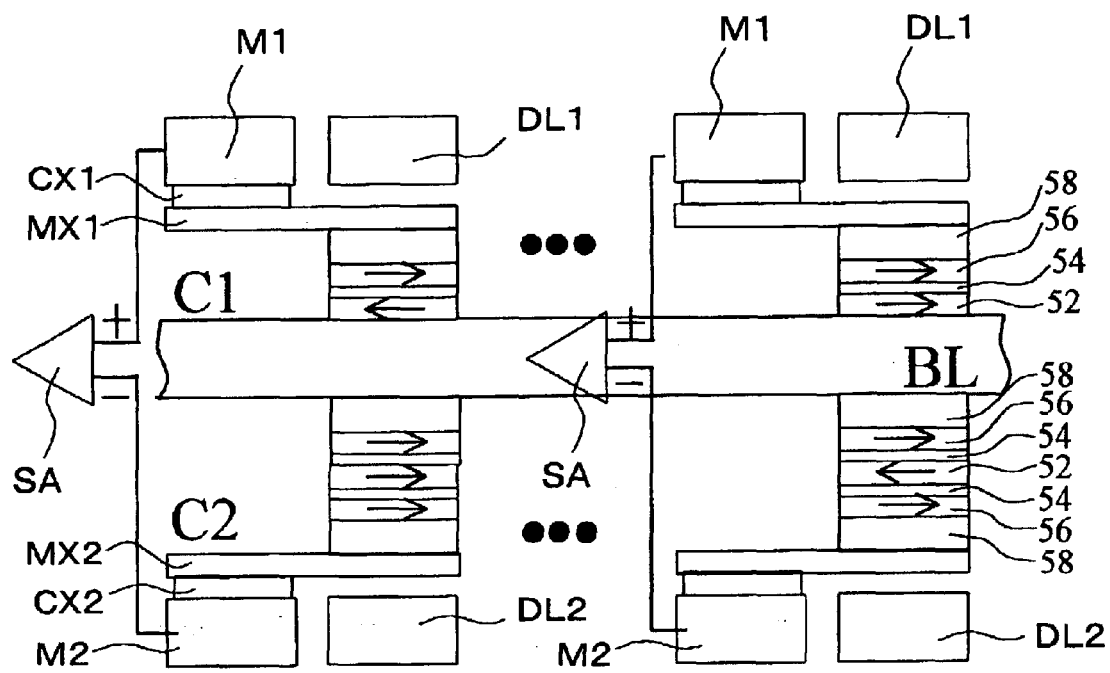
FIGS. 32A and 32B are cross-sectional schematic diagrams showing a memory cell of a multi-valued recording type made by using the architecture of FIG. 28.
Figure 32B:
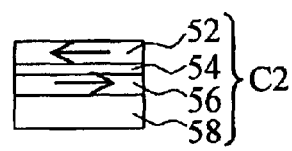

FIGS. 32A and 32B are cross-sectional schematic diagrams showing a memory cell of a multi-valued recording type made by using the architecture of FIG. 28. Also in FIGS. 29, 32A and 32B, only the bit lines BL, magnetoresistance effect elements C and digit lines DL are shown, and the other components are omitted from illustration for simplicity.

Also in the memory cell shown in FIGS. 32A and 32B for the purpose of obtaining different output voltages from the pair of magnetoresistance effect elements C1, C2, a single ferromagnetic junction is formed in the magnetoresistance effect element C1 and double ferromagnetic tunneling junctions are formed in the other magnetoresistance effect element C2. These memory cells are operative under the same operation principle as that already explained in conjunction with FIGS. 1 through 19.

The memory cell shown in FIG. 29 uses single-tunneling elements are used as the magnetoresistance effect elements C1, C2.

The memory cell shown in FIG. 30 uses double-tunneling elements are used as the magnetoresistance effect elements C1, C2.

In the memory cell shown in FIG. 31, both magnetoresistance effect elements C1, C2 have a single ferromagnetic tunneling junction, and the recording layer has a three-layered structure stacking a ferromagnetic layer FM, non-magnetic layer NM and ferromagnetic layer FM.

In the memory cell shown in FIGS. 32A and 32B, for the purpose of facilitating multi-valued recording, the upper magnetoresistance effect element C1 has a single tunneling junction and the lower magnetoresistance effect element C2 has double tunneling junction such that these elements issue different outputs. However, the magnetoresistance effect element C2 may be modified to a single-tunneling structure as shown in FIG. 32B. In this case, by changing the material or thickness of at least one layer from that of the magnetoresistance effect element C1, a different output from that of the magnetoresistance effect element C1 can be obtained. This configuration also facilitates multi-valued recording.

Next explained is the overcoat layer SM usable to coat the wiring in the memory cell according to the embodiment.

Figures 33A, 33B:
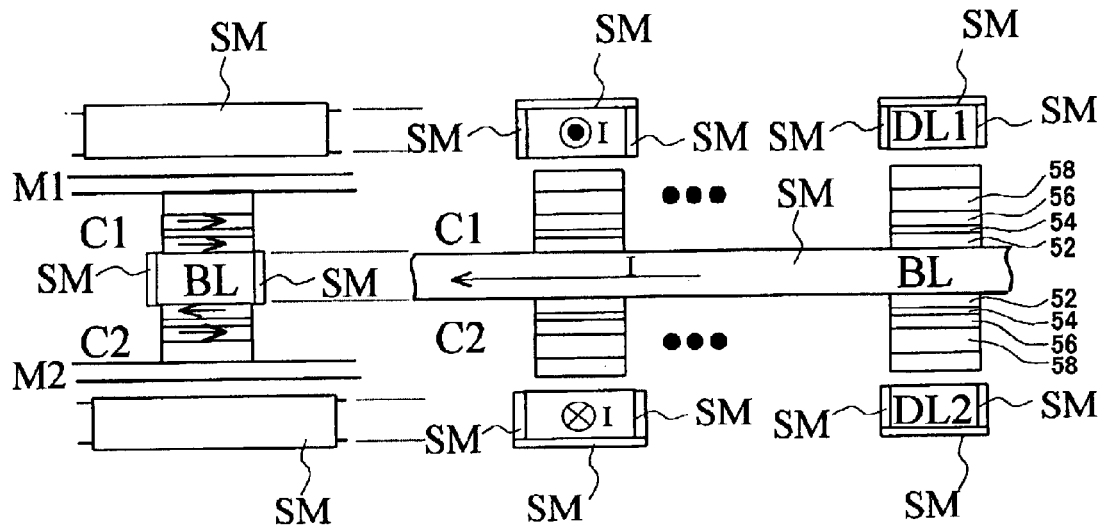
FIGS. 33A and 33B are schematic diagrams exemplifying a memory cell including an overcoat layer SM.
Figures 34A, 34B:
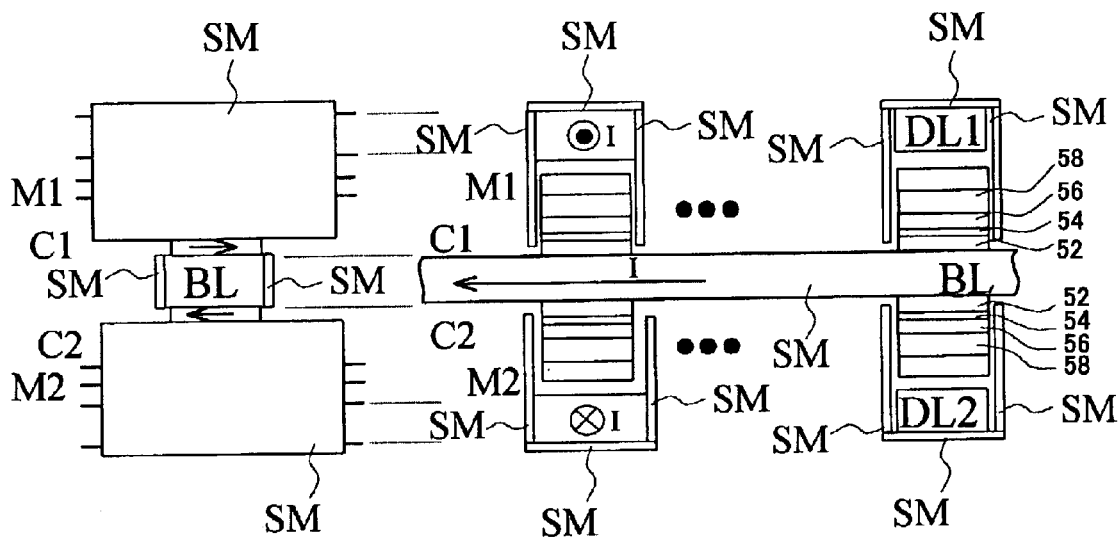
FIGS. 34A and 34B are schematic diagrams exemplifying a memory cell including an overcoat layer SM.
Figures 35A, 35B:
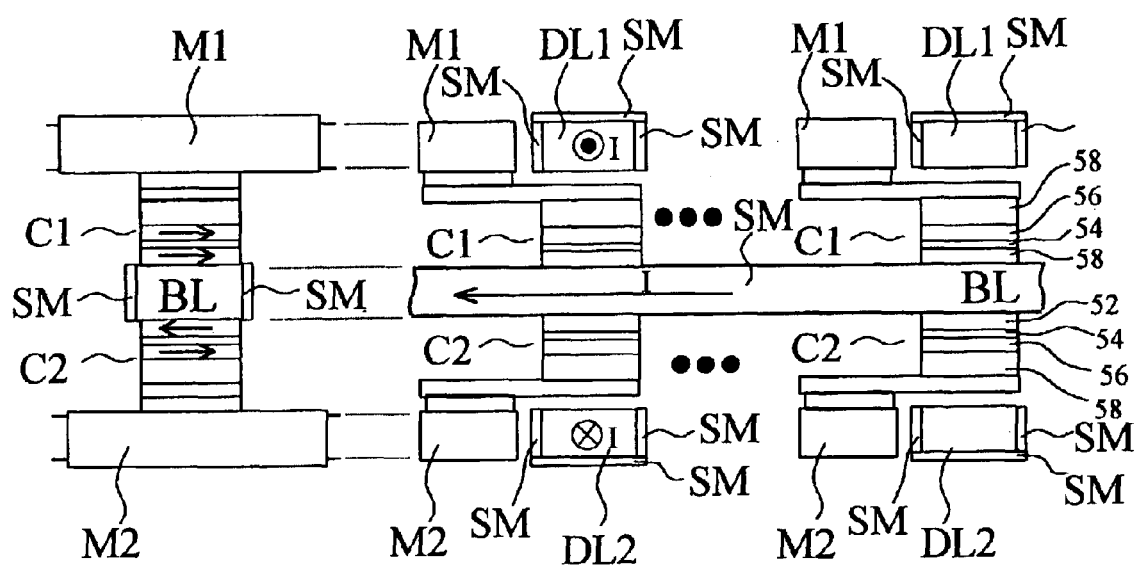
FIGS. 35A and 35B are schematic diagrams exemplifying a memory cell including an overcoat layer SM.

FIGS. 33A through 35B are schematic diagrams exemplifying memory cells including an overcoat layer SM. FIGS. 33A, 34A and 35A are cross-sectional views taken along planes perpendicular to the lengthwise directions of the bit lines BL whereas FIGS. 33B, 34B and 35B are cross-sectional views taken along planes parallel to the lengthwise directions.

FIGS. 33A and 33B show a model corresponding to the memory cell shown in FIG. 1 but including the overcoat layer SM. The overcoat layer SM of a magnetic material surrounds the outer periphery of the wiring (digit lines DL and bit lines BL). That is, part of the outer surface of the wiring (digit lines DL and bit lines BL) of copper (Cu) or the like, which need not exert a magnetic field, is covered by the overcoat layer SM. This overcoat layer SM prevents writing cross talk by writing magnetic fields radiated from the digit lines DL and bit lines BL, that is, useless, undesirable writing to other magnetoresistance effect elements adjacent in the lateral and film-stacking directions.

Therefore, the overcoat layer SM functions to prevent leakage of the magnetic field, and its appropriate materials are amorphous materials such as $FeO_x$ (iron oxide), CoZnNb (cobalt zinc niobate), and magnetic alloys such as CoFeNi (cobalt iron nickel), NiFe (nickel iron) and Permalloy (trademark).

As shown in FIGS. 34A and 34B, the overcoat layer SM may be extended to side surfaces of the magnetoresistance effect elements C1, C2. In this case, the overcoat layer SM effectively prevents radiation of the writing magnetic field from the write digit lines DL1, DL2 and can efficiently concentrate it to the recording layers of the magnetoresistance effect elements C1, C2. In this sense, the overcoat layer SM made of a magnetic metal functions as a so-called "magnetic yoke" as well. Therefore, if the overcoat layer SM is extended closely to the recording layers of the magnetoresistance effect elements C1, C2, it is possible to concentrate the writing current magnetic field to the recording layers via the overcoat layer SM and thereby enhance the writing efficiency more.

When the overcoat layer is extended as shown in FIGS. 34A and 34B, the extended portion need not be continuous. It is sufficient that part of the overcoat layer SM covering the digit lines D1, D2 is in magnetic coupling with part of the overcoat layer SM located closely to the magnetoresistance effect elements C1, C2, and spaces or other materials may exist between those parts.

FIGS. 33A and 33B show a model corresponding to the memory cell shown in FIG. 29 but including the overcoat layer SM. The overcoat layer SM of a magnetic material surrounds the outer periphery of the wiring (digit lines DL and bit lines BL). This overcoat layer SM prevents writing cross talk by writing magnetic fields radiated from the digit lines DL and bit lines BL, that is, useless and undesirable writing to other magnetoresistance effect elements adjacent in the lateral and film-stacking directions.

Also in this model, the overcoat layer SM may be extended to side surfaces of the magnetoresistance effect elements C1, C2 to effectively prevent radiation of the writing magnetic field and function as a magnetic yoke to concentrate the magnetic field to the recording layers.

Figure 36:
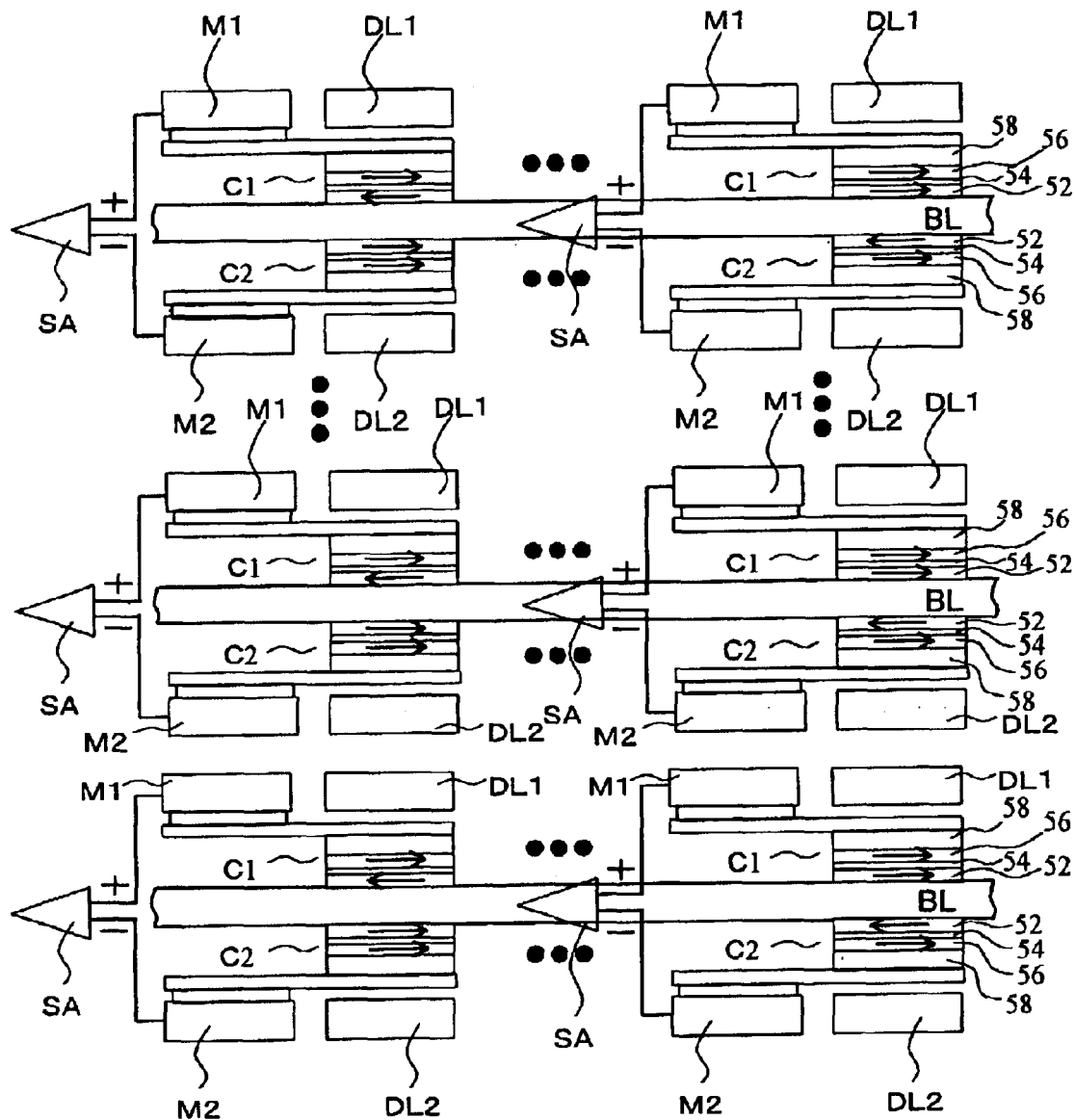
FIG. 36 is a schematic diagram exemplifying a cross-sectional structure of a magnetic memory made by stacking memory cells of the architecture of the differential operation type shown in FIG. 29.

FIG. 36 is a schematic diagram exemplifying a cross-sectional structure of a magnetic memory made by stacking memory cells of the architecture of the differential operation type shown in FIG. 29. By stacking matrix-type differentially operative memory cells in this manner, a highly integrated large-capacity memory can be realized. Not limited to the model shown in FIG. 29, this multi-layered structure can be similarly employed to other architectures of differential operation types explained heretofore.

Figure 37:
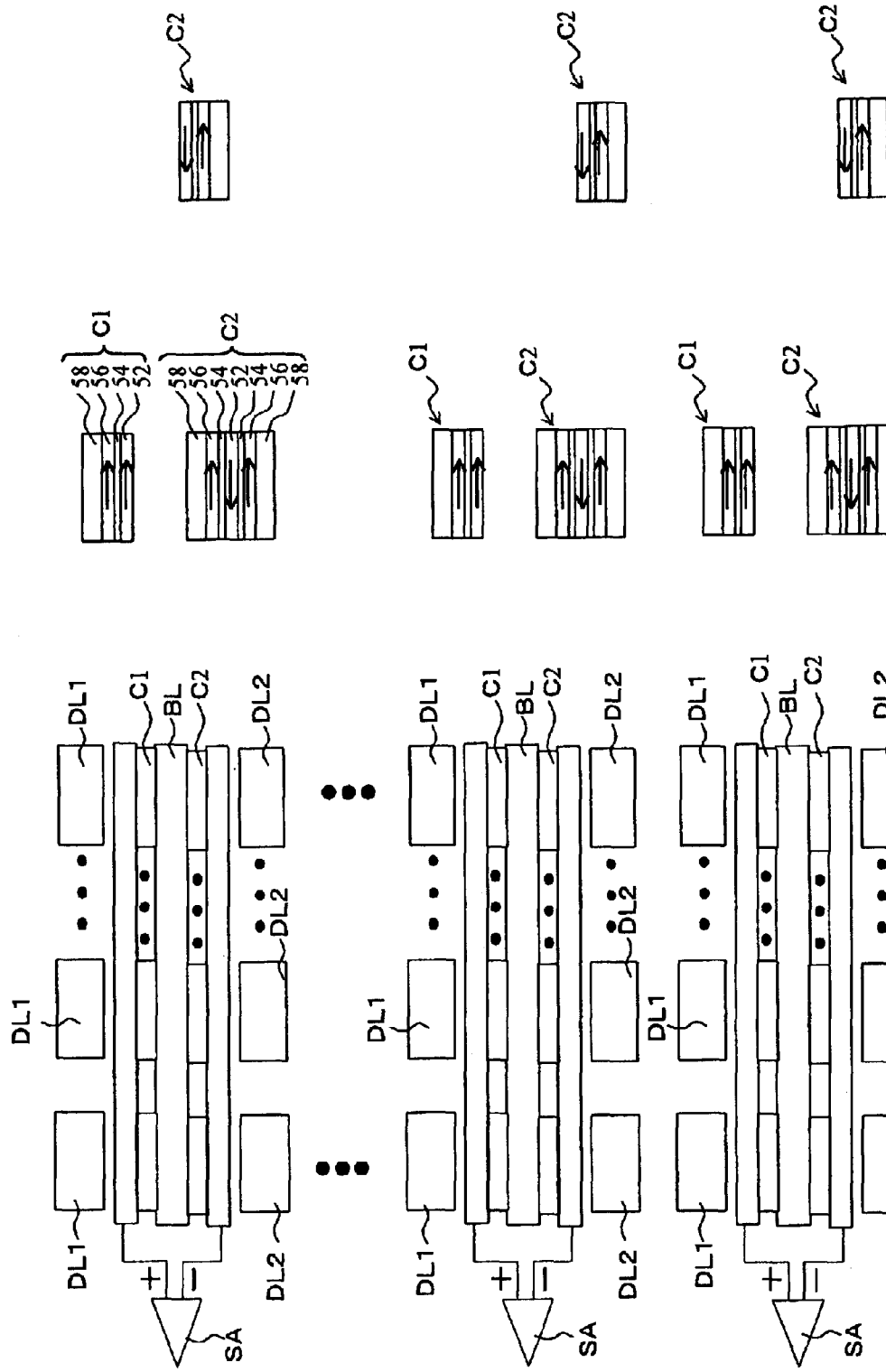
FIGS. 37A through 37C are schematic diagrams exemplifying a cross-sectional structure of a magnetic memory made by stacking memory cells of the architecture of the multi-valued recording type shown in FIG. 24.

FIGS. 37A through 37C are schematic diagrams exemplifying a cross-sectional structure of a magnetic memory made by stacking memory cells of the architecture of the multi-valued recording type shown in FIG. 24. Also in a multi-valued recording model, by stacking memory cells in a matrix arrangement, a highly integrated large-capacity memory can be realized. Not limited to the model shown in FIG. 24, this multi-layered structure can be similarly employed to other architectures of differential operation types explained heretofore.

Also in the memory cell shown in FIG. 37A, for the purpose of obtaining different output voltages from the pair of magnetoresistance effect elements C1, C2, a single ferromagnetic junction is formed in the magnetoresistance effect element C1 and double ferromagnetic tunneling junctions are formed in the other magnetoresistance effect element C2 as shown in FIG. 37B. Alternatively, the lower magnetoresistance effect element C2 may have a single-tunneling structure similarly to the upper magnetoresistance effect element C1, and may be changed in material or thickness of at least one layer from that of the upper element C1 to issue an output different from that of the upper element C1.

In some embodiments of the invention, by forming the pair of magnetoresistance effect elements C1, C2 in combination for differential operation or multi-valued recording on and under the bit line BL, fluctuation of the wiring path between the upper and lower magnetoresistance effect elements can be prevented. Also by specially designing the wiring structure of read wirings M1, M2 and others, the wiring environments including the path length and parasitic capacitance can be uniformed.

Figures 38, 39:
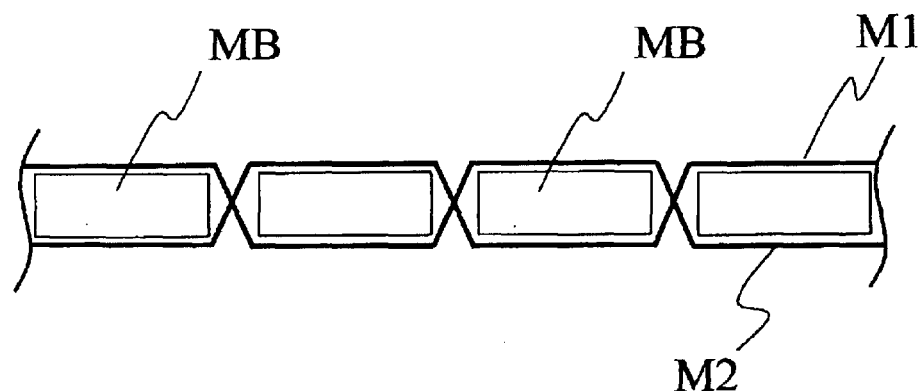
FIG. 38 is a schematic diagram showing a memory cross-sectional structure capable of uniforming the wiring environments of read wirings M1, M2.
FIG. 39 is a table showing measured values of output voltages of magnetoresistance effect elements C1, C2 obtained in the first Example of the invention.

FIG. 38 is a schematic diagram showing a memory cross-sectional structure capable of uniforming the wiring environments of read wirings M1 and M2. The magnetic memory is made by integrating a plurality of memory cells in a matrix arrangement. In this model, these memory cells are divided into a plurality memory blocks MB, and the read wirings M1, M2 are formed to cross between these memory blocks MB. That is, the read wirings M1, M2 are formed to revert the upper and lower positional relation for every memory block.

The term "memory block" used here means a group of a predetermined number of adjacent memory cells, such as 256 memory cells for example, and a plurality of such memory blocks compose the magnetic memory. However, the number of memory cells belonging to a single memory block need not be equal in all memory blocks.

The configuration shown in FIG. 38 enables substantial equalization of the wiring environments such as wiring length and parasitic capacity between read wirings M1 and M2. That is, the read wirings M1, M2 can be equalized in deterioration of the signal level, delay of the transmission speed, and so on. As a result, the it is possible to equalize the pair of magnetoresistance effect elements on and under the bit line BL in deterioration of the signal level and delay of the read signal read out from them, and thereby to stably execute differential operation or multi-valued recording.

The use of the structure for uniforming the wiring environments shown in FIG. 38 is not limited to the read wirings M1, M2. It is similarly usable to bit lines and/or word lines, depending on the memory structure used, and the same effect will be obtained.

EXAMPLES

Embodiments of the invention will be explained below in greater detail with reference to Examples.

First Example

As the first Example of the invention, a memory cell was prepared by stacking two layers of memory cells, based on a memory array of a simple matrix structure as shown in FIGS. 33A through 33C and aligning 3×3 TMR cells and vertically stacking two memory arrays. In this Example, each upper magnetoresistance effect element C1 had a single tunneling junction whereas each lower magnetoresistance effect element C2 had double tunneling junctions.

The structure of the magnetic memory is explained below following its manufacturing procedures.

On a substrate, not shown, a 1 $\mu$m thick wiring layer of copper (Cu) was formed by damascening as the lower-layer wiring M2 and the digit line DL2. Thereafter, an insulating film was formed by CVD (chemical vapor deposition) and a via was made by RIE (reactive ion etching). Then the surface was smoothes by CMP (chemical mechanical polishing).

After that, a multi-layered film of the TMR element C2 having double ferromagnetic tunneling junctions was formed by sputtering. Materials and thicknesses of respective layers were, in the order from the bottom, Ta (30 nm)/Ru (3 nm)/Ir—Mn (8 nm)/CoFe (3 nm)/Ru (1 nm)/CoFe (3 nm)/AlO$_x$ (1 nm)/COFeNi (2 nm)/Cu (1.5 nm)/CoFeNi (2 nm)/AlO$_x$ (1 nm)/CoFe (3 nm)/Ru (1 nm)/CoFe (3 nm)/IrMn (8 nm)/Ta (9 nm)/Ru (30 nm).

Subsequently, using the uppermost Ru (ruthenium) layer as a hard mask, the multi-layered film was etched to the depth reaching the lower Ru/Ta wiring layer MX2 by RIE using a chlorine-based etching gas. Thus an isolated pattern of the TMR element C2 was made out.

Thereafter, by selective etching to the depth of the Ru/Ta wiring MX2 by RIE, the lower-layer connection wiring MX2 was made out.

After that, SiO$_x$ was deposited as the insulator by the low-temperature TEOS (tetra ethyl ortho silicate) method and smoothed by CMP. Then the bit line BL was formed by depositing and patterning a film for it.

After that, a multi-layered film of the TMR element C1 having a single ferromagnetic tunneling junction was formed by sputtering. Materials and thicknesses of respective layers were, in the order from the bottom, Ta (5 nm)/CoFeNi (2 nm)/Cu (1.5 nm)/CoFeNi (2 nm)/AlO$_x$ (1 nm)/CoFe (3 nm)/Ru (1 nm)/CoFe (3 nm)/IrMn (8 nm)/Ta (9 nm)/Ru (30 nm).

In the same manner as explained above, the TMR element C1 was formed and smoothed. Then the connection wiring MX1 was formed and patterned.

After that, a via was formed in the same manner, and copper (Cu) wirings DL1, M1 were formed by plating.

Subsequently, the substrate was introduced into an annealing furnace capable of applying a magnetic field. There, unidirectional anisotropy was given to the magnetic recording layers 52 of the TMR elements C1, C2, and unidirectional anisotropy was given to the magnetically pinned layers 56. For a memory of a differential operation type, the unidirectional anisotropy was given in parallel to the lengthwise direction of the digit line DL. For a memory of a multi-valued recording type, the unidirectional anisotropy is given in parallel to the lengthwise direction of the bit line BL.

With the magnetic memory according to an embodiment of the invention prepared as explained above, an experiment was carried out to measure signal outputs, differential operation and effectiveness of multi-valued operation.

FIG. 39 is a table showing measured values of output voltages of magnetoresistance effect elements C1, C2 obtained in the first embodiment of the invention. More specifically, output voltages $V_{AP}$ in the anti-parallel state and output voltages $V_P$ in the parallel state of the TMR elements C1, C2 are shown. It is appreciated also from this results that the TMR element C2 having double junctions exhibits a larger output difference between the anti-parallel state and the parallel state.

FIGS. 40A and 40B are graph diagrams showing a result of differential operation in the memory cell according to this Example. While a predetermined current is supplied to the digit lines DL1, DL2, a pulsating write current is supplied to the bit line BL as shown in FIG. 40A. In this manner, it is possible to carry out writing in opposite directions simultaneously in the recording layers 52 of the TMR elements C1, C2 and to record information corresponding to "1" of two-valued information.

After that, by supplying write current pulses in opposite directions to the bit line BL, writing for magnetizing the recording layers of the TMR elements C1, C2 in opposite directions. In this manner, information corresponding to "0" of the two-valued information can be recorded.

The output difference between "1" and "0" obtained in this manner reaches 250 mV in the differential operation mode. This value is equal to the value obtained by integration of 170 mV as the output difference (Va–Vb) upon writing in the TMR element C2 alone and 80 mV as the output difference (Vc–Vd) upon writing in the TMR element C1 alone.

That is, differential operation increases the output difference of two-valued information and enables recording and reproduction with a high S/N ratio. Additionally, according to the embodiment of the invention, by closely stacking the magnetoresistance effect elements C1, C2 on and under the common bit line BL, it is possible to substantially equalize the wiring environments of these elements C1, C2 and thereby remove the problems of offsets of write magnetic fields and read-out values upon differential operation.

Furthermore, this placement of the magnetoresistance effect elements C1, C2 on and under the common bit line BL contributes to downsizing and simplifying the magnetic memory in structure, and thereby makes higher integration easy.

Figure 41A:
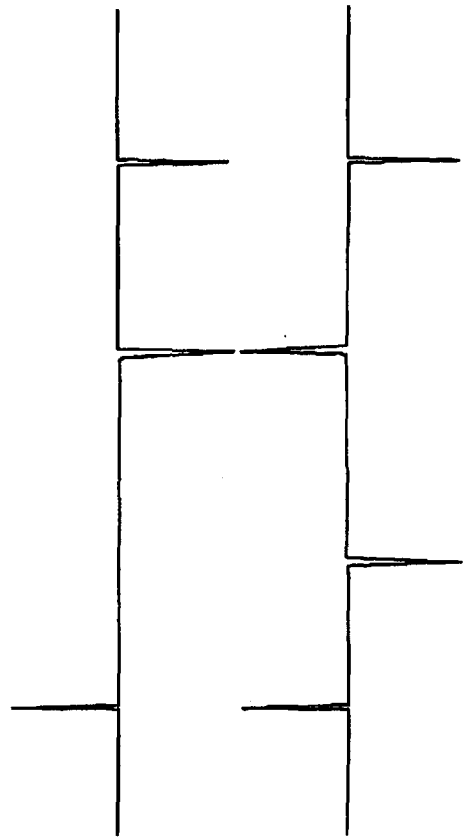
FIGS. 41A and 41B are graph diagrams showing a result of multi-valued recording operation.
Figure 41B:
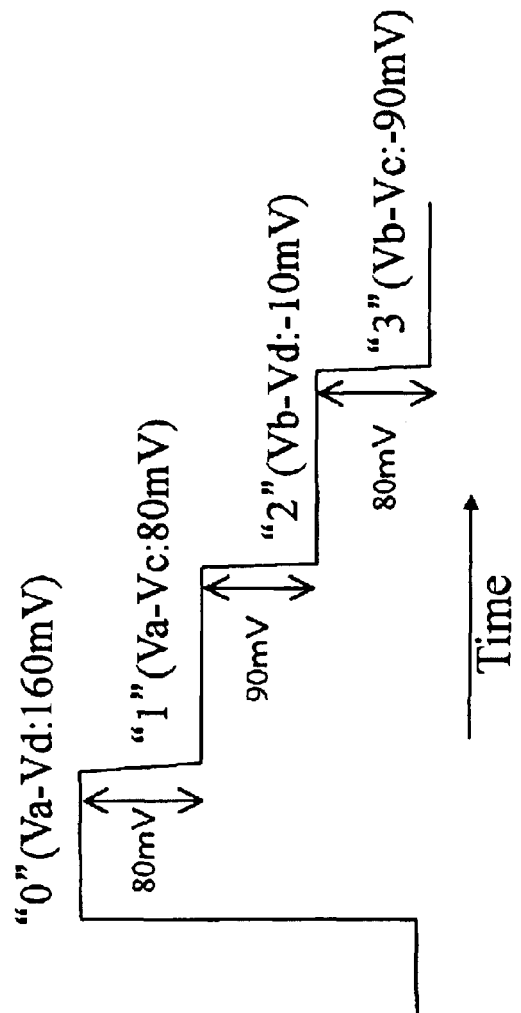

FIGS. 41A and 41B are graph diagrams showing a result of multi-valued recording operation. In case of multi-valued recording operation, by adequately supplying write current pulses to the digit lines DL1, DL2 while supplying a current to the bit line BL, writing is carried out appropriately in the upper and lower magnetoresistance effect elements C1, C2.

Output signals obtained by differential operation of the magnetoresistance effect elements C1, C2 in response to the write pulses shown in FIG. 41A, that is, by taking a difference between their outputs, are as shown in FIG. 41B.

When both of the upper and lower magnetoresistance effect elements C1, C2 are driven to anti-parallel states, the difference of their outputs is Va–Vd, namely, 160 mV. This is determined as the "0" level.

When the magnetoresistance effect element C2 is driven to the anti-parallel state and the magnetoresistance effect element C1 is driven to the parallel state, their output difference is Va–Vc, namely 80 mV. This is determined as "1" level.

When the magnetoresistance effect element C2 is driven to the parallel state and the magnetoresistance effect element C1 is driven to the anti-parallel state, their output difference is Vb–Vb, namely –10 mV. This is determined as "2" level.

When both magnetoresistance effect elements C2, C1 are driven to the parallel state, their output difference is Vb–Vc, namely –90 mV. This is determined as "3" level.

As such, four-valued data "0" to "3" can be set in intervals of 80 to 90 mV, and it enhances the resolution among different data. Thus the four-valued information can be recorded and reproduced reliably and easily.

Additionally, according to the embodiment of the invention, by closely stacking the magnetoresistance effect elements C1, C2 on and under the common bit line BL, it is possible to substantially equalize the wiring environments of these elements C1, C2 and thereby remove the problems of offsets of write magnetic fields and read-out values upon multi-valued recording operation.

Furthermore, this placement of the magnetoresistance effect elements C1, C2 on and under the common bit line BL contributes to downsizing and simplifying the magnetic memory in structure, and thereby makes higher integration easy.

Second Example

As the second Example of the invention, a memory cell was prepared by stacking two layers of memory cells, based on a memory array of a "ladder type" structure as shown in FIGS. 24A through 24C and aligning 3×3 TMR cells and vertically aligning two memory arrays. Here again, each upper magnetoresistance effect element C1 had a single tunneling junction whereas each lower magnetoresistance effect element C2 had double tunneling junctions.

The structure of the magnetic memory is explained below following its manufacturing procedures.

On a substrate, not shown, a 1 $\mu$m thick wiring layer of copper (Cu) was formed by damascening as the lower-layer wiring M2 and the digit line DL2. Thereafter, an insulating film was formed by CVD and smoothed by CMP. Additionally, as the lower-layer bit line BL1, a 1 $\mu$m thick Cu/Ta wiring layer was formed by sputtering, and the multi-layered film of the TMR element C2 having double ferromagnetic tunneling junctions was formed by sputtering.

Materials and thicknesses of respective layers were, in the order from the bottom, Ta (2 nm)/Ru (3 nm)/Pt—Mn (12 nm)/CoFe (2.5 nm)/Ru (1 nm)/CoFe (3 nm)/AlO$_x$ (1 nm)/CoFeNi (1.8 nm)/Ru (1.5 nm)/CoFeNi (1.8 nm) AlO$_x$ (1 nm)/CoFe (3 nm)/Ru (1 nm)/CoFe (2.5 nm)/IrMn (9 nm)/Ta (9 nm)/Ru (30 nm).

Subsequently, using the uppermost Ru (ruthenium) layer as a hard mask, the multi-layered film was etched to the depth reaching the lower Ru/Ta/Cu wiring layer BL1 by RIE using a chlorine-based etching gas. Thus an isolated pattern of the TMR element C2 was made out.

Thereafter, by selective etching to the depth of the Ru/TaCu wiring layer BL1 by RIE, the lower-layer bit line BL1 was made out.

After that, SiO$_x$ was deposited as the insulator by the low-temperature TEOS method and smoothed by CMP. Then the bit line BL2 was formed by depositing and patterning a film for it.

After that, a multi-layered film of the TMR element C1 having a single ferromagnetic tunneling junction was formed by sputtering. Materials and thicknesses of respective layers were, in the order from the bottom, Ta (10 nm)/CoFeNi (2 nm)/Ru (1.5 nm)/CoFeNi (2 nm)/AlO$_x$ (1 nm)/CoFe (3 nm)/Ru (1 nm)/CoFe (2.2 nm)/IrMn (8 nm)/Ta (9 nm)/Ru (30 nm).

In the same manner as that of the TMR element C2, the TMR element C1 was formed and smoothed. Then the bit line BL3 was formed and patterned.

From the next step on, this Example was prepared by substantially the same process as that already explained in conjunction with the first Example. So, its explanation is not repeated here.

Subsequently, the substrate was introduced into an annealing furnace capable of applying a magnetic field. There, unidirectional anisotropy was given to the magnetic recording layers 52 of the TMR elements C1, C2, and unidirectional anisotropy was given to the magnetically pinned layers 56. For a memory of a differential operation type, the unidirectional anisotropy was given in parallel to the lengthwise direction of the digit line DL. For a memory of a multi-valued recording type, the unidirectional anisotropy is given in parallel to the lengthwise direction of the bit line BL.

With the magnetic memory according to an embodiment of the invention prepared as explained above, an experiment was carried out to measure signal outputs, differential operation and effectiveness of multi-valued operation.

FIG. 42 is a table showing measured values of output voltages of magnetoresistance effect elements C1, C2 obtained in the first embodiment of the invention. More specifically, output voltages $V_{AP}$ in the anti-parallel state and output voltages $V_P$ in the parallel state of the TMR elements C1, C2 are shown. It is appreciated also from this results that the TMR element C2 having double junctions exhibits a larger output difference between the anti-parallel state and the parallel state.

FIGS. 43A and 43B are graph diagrams showing a result of differential operation in the memory cell according to this Example. While a predetermined current is supplied to the digit lines DL1, DL2, a pulsating write current is supplied to the bit line BL as shown in FIG. 40A. In this manner, it is possible to carry out writing in opposite directions simultaneously in the recording layers 52 of the TMR elements C1, C2 and to record information corresponding to "1" of two-valued information.

After that, by supplying write current pulses in opposite directions to the bit line BL, writing for magnetizing the recording layers of the TMR elements C1, C2 in opposite directions. In this manner, information corresponding to "0" of the two-valued information can be recorded.

The output difference between "1" and "0" obtained in this manner reaches 280 mV in the differential operation mode. This value is equal to the value obtained by integration of 185 mV as the output difference (Va–Vb) upon writing in the TMR element C2 alone and 95 mV as the output difference (Vc–Vd) upon writing in the TMR element C1 alone.

That is, differential operation here again increases the output difference of two-valued information and enables recording and reproduction with a high S/N ratio. Additionally, according to the embodiment of the invention, by closely stacking the magnetoresistance effect elements C1, C2 on and under the common bit line BL, it is possible to substantially equalize the wiring environments of these elements C1, C2 and thereby remove the problems of offsets of write magnetic fields and read-out values upon differential operation.

Furthermore, this placement of the magnetoresistance effect elements C1, C2 on and under the common bit line BL contributes to downsizing and simplifying the magnetic memory in structure, and thereby makes higher integration easy.

Figures 44A, 44B:
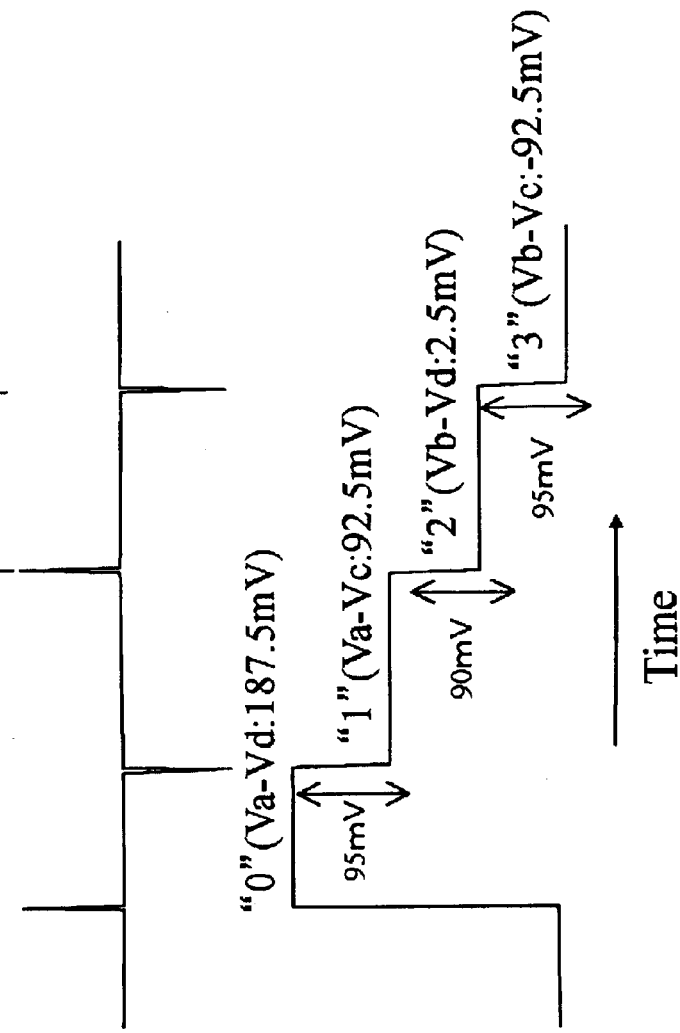
FIGS. 44A and 44B are graph diagrams showing a result of multi-valued recording operation.

FIGS. 44A and 44B are graph diagrams showing a result of multi-valued recording operation. In case of multi-valued recording operation, by adequately supplying write current pulses to the digit lines DL1, DL2 while supplying a current to the bit line BL, writing is carried out appropriately in the upper and lower magnetoresistance effect elements C1, C2.

Output signals obtained by differential operation of the magnetoresistance effect elements C1, C2 in response to the write pulses shown in FIG. 44A, that is, by taking a difference between their outputs, are as shown in FIG. 44B.

When both of the upper and lower magnetoresistance effect elements C1, C2 are driven to anti-parallel states, the difference of their outputs is Va–Vd, namely, 187.5 mV. This is determined as the "0" level.

When the magnetoresistance effect element C2 is driven to the anti-parallel state and the magnetoresistance effect element C1 is driven to the parallel state, their output difference is Va–Vc, namely 92.5 mV. This is determined as "1" level.

When the magnetoresistance effect element C2 is driven to the parallel state and the magnetoresistance effect element C1 is driven to the anti-parallel state, their output difference is Vb–Vb, namely –2.5 mV. This is determined as "2" level.

When both magnetoresistance effect elements C2, C1 are driven to the parallel state, their output difference is Vb–Vc, namely –92.5 mV. This is determined as "3" level.

As such, four-valued data "0" to "3" can be set in intervals of 90 to 95 mV, and it enhances the resolution among different data. Thus the four-valued information can be recorded and reproduced reliably and easily.

Additionally, according to the embodiment of the invention, by closely stacking the magnetoresistance effect elements C1, C2 on and under the common bit line BL, it is possible to substantially equalize the wiring environments of these elements C1, C2 and thereby remove the problems of offsets of write magnetic fields and read-out values upon multi-valued recording operation.

Furthermore, this placement of the magnetoresistance effect elements C1, C2 on and under the common bit line BL contributes to downsizing and simplifying the magnetic memory in structure, and thereby makes higher integration easy.

Third Example

As the third Example of the invention, the whole configuration of a magnetic memory having the wiring structure shown in FIGS. 4 to 5B is next explained below.

Figure 45:
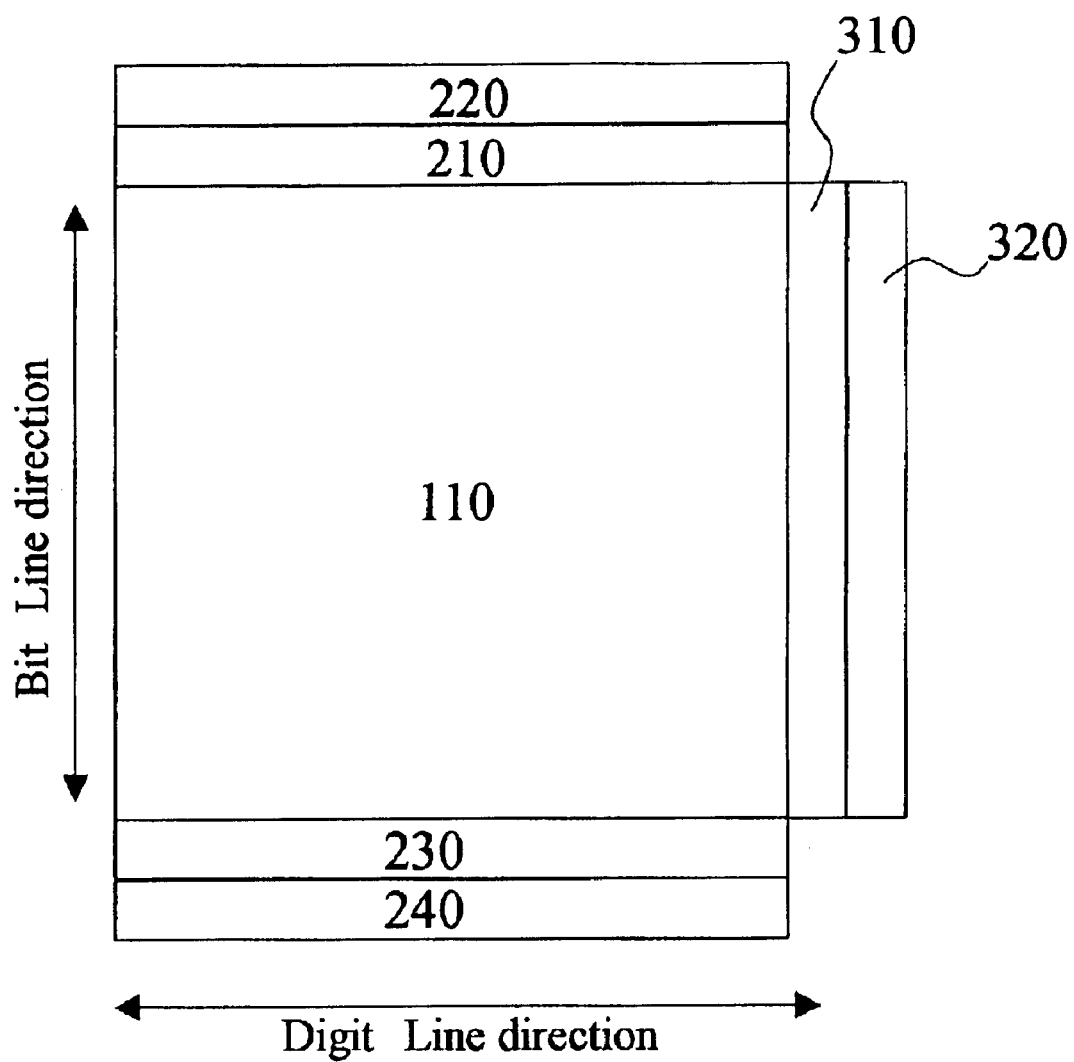
FIG. 45 is a conceptual diagram exemplifying a whole structure of a magnetic memory according to the third Example of the invention.

FIG. 45 is a conceptual diagram exemplifying the whole structure of the magnetic memory according to the third Example of the invention. As already explained with reference to FIGS. 4 through 6, in some embodiments of the invention, write pulses can be supplied from a single power source by connecting corresponding ends of the digit lines DL1, DL2 together, which extend above and below a pair of differentially operated magnetoresistance effect elements C1, C2.

As shown in FIG. 45, the magnetic memory having the wiring structure of this type includes drivers for supplying a current to the bit line BL and sinkers for absorbing a current from the bit line BL, which are located at opposite ends of the memory array, i.e. at its opposite ends in the extending direction of the bit line BL.

In the instant embodiment of the invention, since currents in both forward and backward directions are supplied to the bit line BL, drivers 210, 230 are located at opposite ends of the memory array 110. Similarly, sinkers 220, 240 are located at opposite ends of the memory array 110.

The current supplied from the driver 210 to the bit line BL is absorbed by the sinker 240. A current supplied from the driver 230 to the bit line BL is absorbed by the sinker 220.

In the extending direction of the digit lines DL1, DL2, a driver 310 and a sinker 320 are provided at only one end of the memory array 110. This is because the upper and lower digit lines DL1, DL2 are connected together at one end of their extension to form a single continuous wiring path as explained in conjunction with FIGS. 4 through 6. Therefore, a current supplied to one of the digit lines DL1, DL2 from the driver 310 turns back at their connected end at the other end of the memory array 110 and flows into the other of the digit lines DL1, DL2, and it is thereafter absorbed by the sinker 320.

According to this Example, a single driver 310 and a single sinker 320 are sufficient for supplying a current to the pair of upper and lower digit lines DL1, DL2. Therefore, drivers and sinkers need not be increased, and the ratio of the memory area, i.e. array efficiency, can be enhanced.

Fourth Example

As the fourth Example of the invention, the whole configuration of a magnetic memory having the wiring structure shown in FIGS. 8A to 11C is next explained below.

Figure 46:
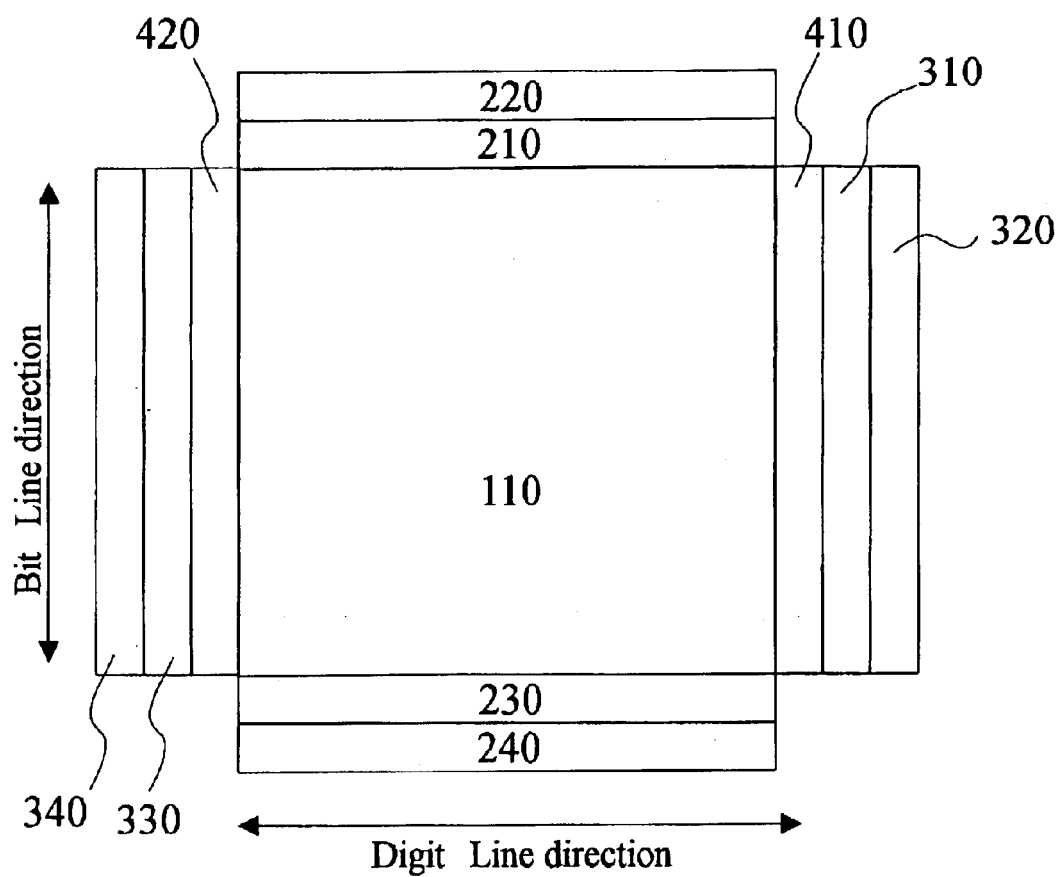
FIG. 46 is a conceptual diagram exemplifying a whole structure of a magnetic memory according to the fourth Example of the invention.

FIG. 46 is a conceptual diagram exemplifying the whole structure of the magnetic memory according to the fourth Example of the invention. As already explained with reference to FIGS. 8A through 11C, in some embodiments of the invention, write pulses can be supplied from a single power source by selectively connecting corresponding ends of the digit lines DL1, DL2 together, which extend above and below a pair of differentially operated magnetoresistance effect elements C1, C2, by means of a switching element Tr1 positioned at one end of the extension of the digit lines DL1, DL2.

As shown in FIG. 46, the magnetic memory having the wiring structure of this type includes drivers for supplying a current to the bit line BL and sinkers for absorbing a current from the bit line BL, which are located at opposite ends of the memory array, i.e. at its opposite ends in the extending direction of the bit line BL.

Its reason lies in the need of supplying currents in both positive and negative directions to the bit line BL as explained in conjunction with FIG. 45, and memory drivers 210, 230 are provided at opposite ends of the memory array 110. Similarly, sinkers 220, 240 are provided at opposite sides of the memory array.

In the extending direction of the digit lines DL1, DL2, drivers 310 and sinkers 320 are provided at opposite ends of the memory array 110 via switching portions 400, 410. This is because the current supplied to the digit lines must be changed in direction depending on the recording mode.

More specifically, as already explained in conjunction with FIGS. 8A through 9C, it is necessary to turn on the switching element Tr1 located at the other end of the digit lines to connect them together, then supply a current from the driver 310 to one of the digit lines DL1, DL2, and absorb the current from the other digit line into the sinker 320. The switching portion 400 is activated to connect the driver 310 and the sinker 320 to one of the digit lines DL1, DL2 in accordance with the intended flowing direction of the current.

In some cases, the upper and lower digit lines are disconnected by turning off the switching element Tr1, thereby to supply write currents in the same direction to these digit lines. In these cases, write current pulses can be sequentially supplied to the upper and lower digit lines DL1, DL2 from one or the other of the drivers 310, 330 by sequentially switching one of the switching portions 410, 420 on the part for supplying the current. This current is absorbed by the sinker connected to the other ends of the digit lines DL1, DL2 via the switching portion.

This Example can supply a current to the pair of upper and lower digit lines DL1, DL2 by using two sets of drivers and sinkers. Therefore, drivers and sinkers need not be increased, and the ratio of the memory area, i.e. array efficiency, can be enhanced.

Heretofore, some embodiments of the invention have been explained with reference to specific examples. The invention, however, is not limited to these specific examples. For example, the invention contemplates in its own cope all alternatives concerning materials, thicknesses, shapes, sizes, etc. of the ferromagnetic layer, insulating film, antiferromagnetic layer, nonmagnetic metal layer, electrode that are components of the magnetoresistance effect element as far as persons skilled in the art can appropriately select them and can practically use the invention to obtain substantially the same effects.

Similarly, the invention contemplates in its own scope all alternatives concerning structures, materials, shapes and sizes of the bit line, digit line, word line, overcoat layer, selection transistor, diode and other composing the magnetic memory according to any embodiment of the invention as far as persons skilled in the art can appropriately select them and can practically use the invention to obtain substantially the same effects.

Furthermore, the invention contemplates in its scope all magnetic memories that persons skilled in the art can make by modifying the magnetic memories shown here as embodiments of the invention.

While the present invention has been disclosed in terms of the embodiment in order to facilitate better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

What is claimed is:

1. A magnetic memory comprising:
    a first wiring extending in a first direction;
    a first magnetoresistance effect element formed on the first wiring and having a magnetic recording layer;
    a second magnetoresistance effect element formed under the first wiring and having a magnetic recording layer;
    a second wiring extending in a direction across the first direction above the first wiring;
    a third wiring extending in a direction across the first direction below the first wiring;
    a recording circuit which supplies a current to the first wiring while supplying a current to the second and third wirings respectively, and thereby exerting a current magnetic field to the magnetic recording layers in order to record one of two values of two-valued information; and
    a reading circuit which detects a difference between output signals obtained from the magnetoresistance effect elements by supplying a sense current to the first and second magnetoresistance effect elements via the first wiring in order to read out the recorded data as one of two values of the two-valued information,
    directions of magnetization in the recording layers of the first and second magnetoresistance effect elements being oriented in opposite directions from each other by supplying the current to the first wiring upon recording of one of two values of the two-valued information.

2. A magnetic memory according to claim 1, wherein each of the first and second magnetoresistance effect elements has a magnetically pinned layer of a ferromagnetic material which is substantially pinned in magnetization in a direction approximately perpendicular to the first direction, and
directions of magnetization in the magnetic recording layers of the first and second magnetoresistance effect elements are substantially perpendicular to the first direction.

3. A magnetic memory according to claim 1, wherein the first and second magnetoresistance effect elements are substantially identical in structure.

4. A magnetic memory according to claim 1, further comprising:
a first read wiring connected to the first magnetoresistance effect element to detect an output signal therefrom; and
a second read wiring connected to the second magnetoresistance effect element to detect an output signal therefrom,
wherein the first and second read wirings change their upper and lower positional relation for every memory block.

5. A magnetic memory according to claim 1, wherein each of the magnetic recording layers of the first and second magnetoresistance effect elements has unidirectional anisotropy with which each of the magnetic recording layers is easily magnetized in a direction along a predetermined axis.

6. A magnetic memory according to claim 1, wherein the first and second magnetoresistance effect elements are positioned in a symmetric relation on and under the first wiring.

7. A magnetic memory according to claim 1, wherein each of the second and third wirings extends in a direction substantially perpendicular to the first direction.

8. A magnetic memory comprising:
a first wiring extending in a first direction;
a first magnetoresistance effect element formed on the first wiring and having a magnetic recording layer;
a second magnetoresistance effect element formed under the first wiring and having a magnetic recording layer;
a second wiring extending in a direction across the first direction above the first wiring;
a third wiring extending in a direction across the first direction below the first wiring;
one end of the second wiring and one end of the third wiring being connected together to form a single current path;
a recording circuit which supplies a current to the first wiring while supplying a current to the single current path, and thereby exerting a current magnetic field to the magnetic recording layers in order to record one of two values of two-valued information; and
a reading circuit which detects a difference between output signals obtained from the magnetoresistance effect elements by supplying a sense current to the first and second magnetoresistance effect elements via the first wiring in order to read out the recorded data as one of two values of the two-valued information,
directions of magnetization in the recording layers of the first and second magnetoresistance effect elements being oriented in opposite
directions from each other by supplying the current to the first wiring upon recording of one of two values of the two-valued information.

9. A magnetic memory according to claim 8, wherein each of the first and second magnetoresistance effect elements has a magnetically pinned layer of a ferromagnetic material which is substantially pinned in magnetization in a direction approximately perpendicular to the first direction, and
directions of magnetization in the magnetic recording layers of the first and second magnetoresistance effect elements are substantially perpendicular to the first direction.

10. A magnetic memory according to claim 8, wherein the first and second magnetoresistance effect elements are substantially identical in structure.

11. A magnetic memory comprising:
a first wiring extending in a first direction;
a first magnetoresistance effect element formed on the first wiring and having a magnetic recording layer;
a second magnetoresistance effect element formed under the first wiring and having a magnetic recording layer;
a second wiring extending in a direction across the first direction above the first wiring;
a third wiring extending in a direction across the first direction below the first wiring;
a recording circuit which supplies a current to the first wiring while supplying a current to at least one of the second and third wirings, and thereby exerting a current magnetic field to at least one of the magnetic recording layers in order to record one of multiple values of multi-valued information; and
a reading circuit which detects a difference between output signals obtained from the magnetoresistance effect elements by supplying a sense current to the first and second magnetoresistance effect elements via the first wiring in order to read out the recorded data as one of multiple values of the multi-valued information.

12. A magnetic memory according to claim 11, wherein each of the first and second magnetoresistance effect elements has a magnetically pinned layer of a ferromagnetic material which is substantially pinned in magnetization in a direction approximately parallel or anti-parallel to the first direction, and
directions of magnetization in the magnetic recording layers of the first and second magnetoresistance effect elements are substantially parallel or anti-parallel to the first direction.

13. A magnetic memory according to claim 11, wherein the first and second magnetoresistance effect elements are different in structure from each other.

14. A magnetic memory according to claim 11, further comprising:
a first read wiring connected to the first magnetoresistance effect element to detect an output signal therefrom; and
a second read wiring connected to the second magnetoresistance effect element to detect an output signal therefrom,
wherein the first and second read wirings change their upper and lower positional relation for every memory block.

15. A magnetic memory according to claim 11, wherein each of the magnetic recording layers of the first and second magnetoresistance effect elements has unidirectional anisotropy with which each of the magnetic recording layers is easily magnetized in a direction along a predetermined axis.

16. A magnetic memory according to claim 11, wherein the first and second magnetoresistance effect elements are positioned in a symmetric relation on and under the first wiring.

17. A magnetic memory according to claim 11, wherein each of the second and third wirings extends in a direction substantially perpendicular to the first direction.

18. A magnetic memory comprising:

a first wiring extending in a first direction;

a first magnetoresistance effect element formed on the first wiring and having a magnetic recording layer;

a second magnetoresistance effect element formed under the first wiring and having a magnetic recording layer;

a second wiring extending in a direction across the first direction above the first wiring;

a third wiring extending in a direction across the first direction below the first wiring;

a switching element connected between one end of the second wiring and one end of the third wiring;

a recording circuit which controls the switching element to hold the one end of the second wiring and the one end of the third wiring in connection to form a single current path and supplies a current to the first wiring while supplying a current to the single current path, and thereby exerting a current magnetic field to the magnetic recording layers in order to record one of multiple values of multi-valued information, the recording circuit controlling the switching element to hold the one end of the second wiring and the one end of the third wiring in disconnection and supplying a current to the first wiring while supplying a current to at least one of the second and third wirings, and thereby exerting a current magnetic field to at least one of the magnetic recording layers in order to record another of multiple values of the multi-valued information; and a reading circuit which detects a difference between output signals obtained from the magnetoresistance effect elements by supplying a sense current to the first and second magnetoresistance effect elements via the first wiring in order to read out the recorded data as one of multiple values of the multi-valued information.

19. A magnetic memory according to claim 18, wherein each of the first and second magnetoresistance effect elements has a magnetically pinned layer of a ferromagnetic material which is substantially pinned in magnetization in a direction approximately parallel or anti-parallel to the first direction, and directions of magnetization in the magnetic recording layers of the first and second magnetoresistance effect elements are substantially parallel or anti-parallel to the first direction.

20. A magnetic memory according to claim 18, wherein the first and second magnetoresistance effect elements are different in structure from each other.

21. A magnetic memory according to claim 18, wherein each of the magnetic recording layers of the first and second magnetoresistance effect elements has unidirectional anisotropy with which each of the magnetic recording layers is easily magnetized in a direction along a predetermined axis.

* * * * *